United States Patent
Makem et al.

(10) Patent No.: US 10,956,625 B2
(45) Date of Patent: Mar. 23, 2021

(54) MESH GENERATION SYSTEM AND METHOD

(71) Applicant: Siemens Industry Software Inc., Plano, TX (US)

(72) Inventors: Jonathan Makem, Girton (GB); Nilanjan Mukherjee, Cincinnati, OH (US)

(73) Assignee: Siemens Industry Software Inc., Plano, TX (US)

( * ) Notice: Subject to any disclaimer, the term of this patent is extended or adjusted under 35 U.S.C. 154(b) by 706 days.

(21) Appl. No.: 14/842,039

(22) Filed: Sep. 1, 2015

(65) Prior Publication Data

US 2017/0061037 A1  Mar. 2, 2017

(51) Int. Cl.
| | |
|---|---|
| *G06T 17/20* | (2006.01) |
| *G06T 17/10* | (2006.01) |
| *G06F 30/23* | (2020.01) |
| *G06F 30/00* | (2020.01) |

(52) U.S. Cl.
CPC .............. *G06F 30/00* (2020.01); *G06F 30/23* (2020.01); *G06T 17/10* (2013.01); *G06T 17/20* (2013.01)

(58) Field of Classification Search
None
See application file for complete search history.

(56) References Cited

U.S. PATENT DOCUMENTS

| | | | |
|---|---|---|---|
| 5,345,490 A | | 9/1994 | Finnigan et al. |
| 5,497,451 A | * | 3/1996 | Holmes .................. G06T 17/20 345/420 |
| 6,940,506 B2 | * | 9/2005 | Mashimo ............ G06F 17/5018 345/423 |

(Continued)

FOREIGN PATENT DOCUMENTS

| | | |
|---|---|---|
| CN | 102254352 A | 11/2011 |
| CN | 102598002 A | 7/2012 |

(Continued)

OTHER PUBLICATIONS

Ghosh, Subir Kumar "Approximation Algorithms for Art Gallery Problems in Polygons and Terrains", 2011, 43 pages.*

(Continued)

*Primary Examiner* — Akash Saxena

(57) ABSTRACT

A system and method is provided that facilitates generating meshes for object models of structures for use with finite element analysis simulations carried out on the structure. The system may include at least one processor configured to classify a type of an input face of a three dimensional (3D) object model of a structure based at least in part on a number of loops included by the input face. The processor may also select based on the classified type of the input face a multi-block decomposition algorithm from among a plurality of multi-block decomposition algorithms that the processor is configured to use. Further the processor may use the selected multi-block decomposition algorithm to determine locations of a plurality of blocks across the input face.

(Continued)

In addition the processor may mesh each block to produce mesh data defining a mesh that divides the input face into a plurality of quadrilateral elements.

19 Claims, 22 Drawing Sheets

(56) References Cited

U.S. PATENT DOCUMENTS

| | | | |
|---|---|---|---|
| 7,714,867 B2* | 5/2010 | Doi | G06T 17/10 345/419 |
| 8,089,480 B2* | 1/2012 | Chang | G06T 17/20 345/423 |
| 8,473,261 B2 | 6/2013 | Mora Ordonez et al. | |
| 9,830,744 B1* | 11/2017 | Kanthasamy | G06T 17/20 |
| 2004/0032408 A1* | 2/2004 | Doi | G06T 17/20 345/420 |
| 2004/0108999 A1* | 6/2004 | Martin | G06T 17/20 345/423 |
| 2005/0093862 A1* | 5/2005 | Boier-Martin | G06T 17/20 345/420 |
| 2007/0011646 A1* | 1/2007 | Chrisochoides | G06T 17/20 716/55 |
| 2008/0143712 A1* | 6/2008 | McBagonluri | G06F 17/5009 345/420 |
| 2009/0058853 A1* | 3/2009 | Chang | G06T 17/20 345/423 |
| 2009/0092301 A1 | 4/2009 | Jerebko et al. | |
| 2010/0053170 A1 | 3/2010 | Esquej Alonso et al. | |
| 2012/0029882 A1 | 2/2012 | Bommes et al. | |
| 2016/0117859 A1* | 4/2016 | Perbet | G06T 17/20 345/423 |
| 2017/0061037 A1* | 3/2017 | Makem | G06T 17/10 |

FOREIGN PATENT DOCUMENTS

| | | |
|---|---|---|
| JP | H03134775 A | 6/1991 |
| JP | H05120385 A | 5/1993 |

OTHER PUBLICATIONS

Huang et al. "Automatic Generation of Quadrilateral Multi-Block Topology for FEA/CFD Applications", 2002, IEEE, pp. 1300-1305.*

Fogg et al. "New techniques for enhanced medial axis based decompositions in 2-D", 2014, Procedia Engineering, 13 pages.*

Gould et al. "Automated Two-Dimensional Multi-block Meshing using the Medial Object", 2011, 18 pages.*

Malcevic, Ivan. "Automated Blocking for Structured CFD Gridding with an Application to Turbomachinery Secondary Flows", 2011, 20$^{th}$ AIAA Computational Fluid Dynamics Conference, 14 pages.*

Sarrate et al. "Unstructured and Semi-Structured Hexahedral Mesh Generation Methods", Sep. 2014, 32 pages.*

Makem J.E., Fogg H.J., Mukherjee N. (2019) Medial Axis Based Bead Feature Recognition for Automotive Body Panel Meshing. In: Roca X., Loseille A. (eds) 27th International Meshing Roundtable. IMR 2018. Lecture Notes in Computational Science and Engineering, vol. 127. Springer. pp. 26 (Year: 2019).*

Beatty, K., Mukherjee, N., "Flattening 3D Triangulations for Quality Surface Mesh Generation", Proc. 17th International Meshing Roundtable, Springer, 2008,125-139.

Beatty, K., Mukherjee, N., "A Transfinite Meshing Approach for Body-In-White Analyses", Proc. 19th International Meshing Roundtable, Springer, 2010, 49-65.

Blum, H., "A transformation for extracting new descriptors of shape. Models for the Perception of Speech and Visual Form", Ed. W. Wathen Dunn, MIT Press, 1967, pp. 362-380.

Chvátal, V., "A Combinatorial Theorem in Plane Geometry", Journal of Combinatorial Theory (B) 18, 39-41 (1975), Centre de Recherches Mathématiques, Université de Montréal, Montreal 101, Quebec, Canada, Received Mar. 15, 1974.

Fogg, H.J., Armstrong, C.G., Robinson, T.T., "Automatic generation of multiblock decompositions of surfaces", International Journal for Numerical Methods in Engineering, 2015, 101, 965-991.

Gould, J., Martineau, D., Fairey, R., "Automated two-dimensional multi-block meshing using the Medial Object", Proceedings of the 20th International Meshing Roundtable, 2012, 437-452.

Kawolski, N., Ledoux, F., Frey, P., "A PDE based approach to multidomain partitioning and quadrilateral meshing", Proceedings of the 21st International Meshing Roundtable, 2013, pp. 1-18.

Malcevic, I., "Automated blocking for structured CFD gridding with an application to turbomachinery secondary flows", In: 20th AIAA Computational Fluid Dynamics Conference, Honolulu, Hawaii, Jun. 27-30, pp. 1-14.

Pellenard, B., Orbay, G., Chen, J., Sohan, S., Kwok, W., Tristano, J.R., "QMCF: QMorph Cross Field-Driven Quad-Dominant Meshing Algorithm", Procedia Engineering, vol. 82, 2014, 338-350.

Rigby, David L., "TopMaker: A Technique for Automatic Multi-Block Topology Generation Using the Medial Axis", Prepared for the Fourth Joint Fluids Engineering Conference cosponsored by the American Society of Mechanical Engineers and the Japan Society of Mechanical Engineers, Honolulu, Hawaii, Jul. 6-10, 2003, NASA/CR-2004213044, Apr. 2004, pp. 1-16.

Sluiter, M. L. and Hansen, D.L., "A general purpose automatic mesh generator for shell and solid finite elements", Computers in Engineering, ASME, pp. 29-34, 1982.

Tam, T, Armstrong, C.G, "2D finite element mesh generation by medial axis subdivision". Advances in Engineering Software, vol. 13, 1991, pp. 313-324.

White, David R., Mingwu, Lai, Benzley,Steven E. and Sjaardema, Gregory D., "Automated Hexahedral Mesh Generation by Virtual Decomposition", Proceedings, 4th International Meshing Roundtable, Sandia National Laboratories, pp. 165-176, Oct. 1995.

Huang et al., "Automatic Generation of Quadrilateral Multi-Block Topology for Fenced Applications", Industrial Technology, 2002, IEEE ICIT '02, 2002 IEEE International Conference on Dec. 11-14, 2002, Piscataway, NJ, USA, IEEE, Piscatawy, NJ, USA, vol. 2, 11 Dec. 2002, pp. 1300-1305.

Robert Schneiders, "Algorithms for Quadrilateral and Hexahedral Mesh Generation", Jan. 2000, pp. 1-56, Retrieved from the Internet: URL:http://www.robertschneiders.de/papers/vki.pdf [retrieved on Oct. 11, 2016].

PCT International Search Report and Written Opinion dated Oct. 19, 2016 corresponding to PCT Application No. PCT/US2016/046960 filed Aug. 15, 2016 (13 pages).

* cited by examiner

Delaunay Tessellation

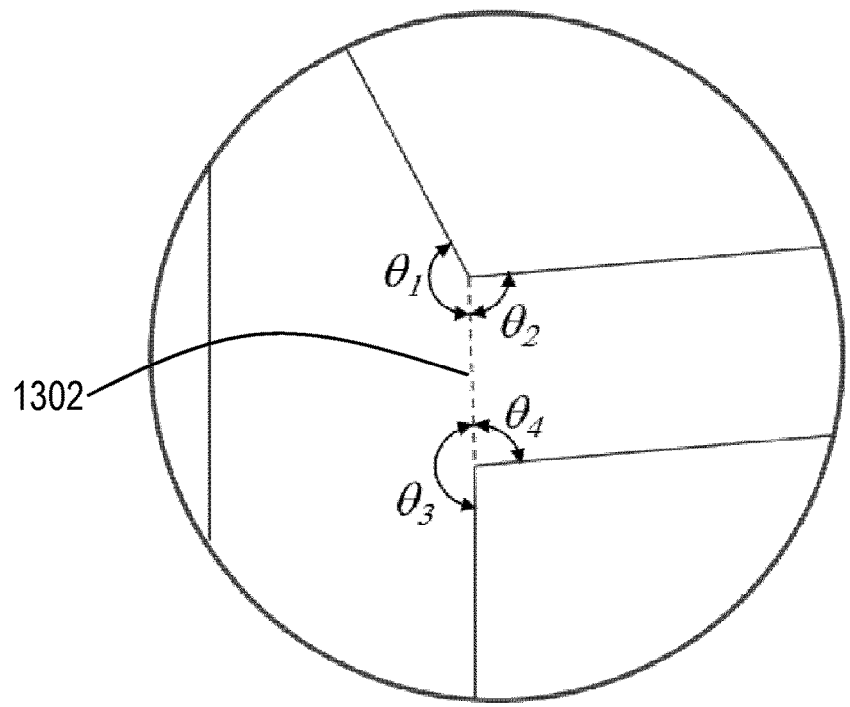

FIG. 15
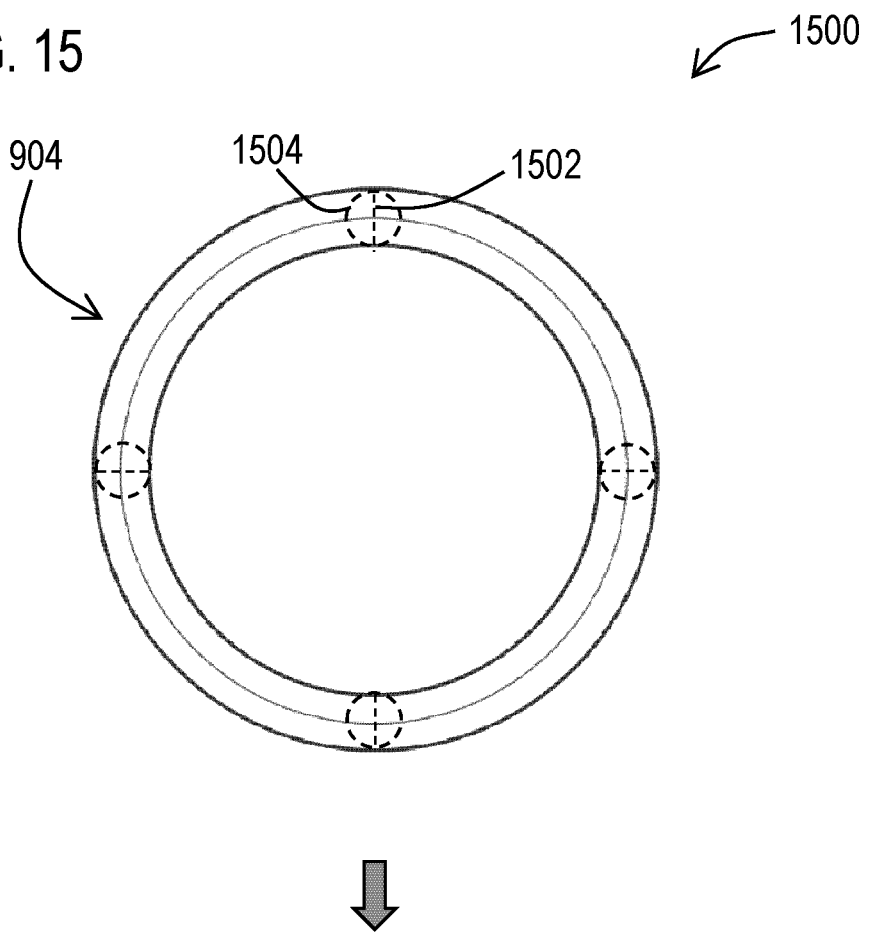
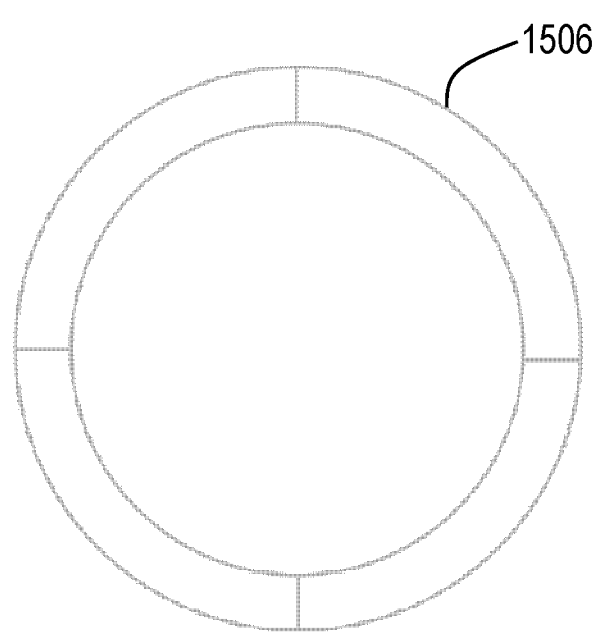

MESH GENERATION SYSTEM AND METHOD

TECHNICAL FIELD

The present disclosure is directed, in general, to computer-aided engineering (CAE), computer-aided design (CAD), visualization, and manufacturing systems, product data management (PDM) systems, product lifecycle management (PLM) systems, and similar systems, that are used to create, use, and manage data for products and other items (collectively referred to herein as product systems).

BACKGROUND

PLM systems may include components that facilitate the design and simulated testing of product structures. Such components may benefit from improvements.

SUMMARY

Variously disclosed embodiments include systems and methods that may be used to facilitate generating meshes for object models of structures for use with finite element analysis simulations carried out on the structure via computer-aided engineering (CAE) software. In one example, a system may comprise at least one processor. The at least one processor may be configured to classify a type of an input face of a three dimensional (3D) object model of a structure based at least in part on a number of loops included by the input face. The at least one processor may also be configured to select, based on the classified type of the input face, a multi-block decomposition algorithm from among a plurality of multi-block decomposition algorithms that the processor is configured to use. Further, the at least one processor may be configured to use the selected multi-block decomposition algorithm to determine locations of a plurality of blocks (e.g., such as via split lines) across the input face. In addition the at least one processor may be configured to mesh each block to produce data representative of a mesh that divides the input face into a plurality of quadrilateral elements.

In another example, a method may include various acts carried out through operation of at least one processor. Such a method may include classifying a type of an input face of a three dimensional (3D) object model of a structure, based at least in part on a number of loops included by the input face; selecting based on the classified type of the input face, a multi-block decomposition algorithm from among a plurality of multi-block decomposition algorithms that the processor is configured to use; using the selected multi-block decomposition algorithm to determine locations of a plurality of blocks (e.g., such as via split lines) across the input face; and meshing each block to produce data representative of a mesh that divides the input face into a plurality of quadrilateral elements.

A further example may include non-transitory computer readable medium encoded with executable instructions (such as a software component on a storage device) that when executed, causes at least one processor to carry out this described method.

The foregoing has outlined rather broadly the technical features of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiments disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the Detailed Description below, it may be advantageous to set forth definitions of certain words or phrases that may be used throughout this patent document. For example, the terms "include" and "comprise," as well as derivatives thereof, mean inclusion without limitation. The singular forms "a", "an" and "the" are intended to include the plural forms as well, unless the context clearly indicates otherwise. Further, the term "and/or" as used herein refers to and encompasses any and all possible combinations of one or more of the associated listed items. The term "or" is inclusive, meaning and/or, unless the context clearly indicates otherwise. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Also, although the terms "first", "second", "third" and so forth may be used herein to describe various elements, functions, or acts, these elements, functions, or acts should not be limited by these terms. Rather these numeral adjectives are used to distinguish different elements, functions or acts from each other. For example, a first element, function, or act could be termed a second element, function, or act, and, similarly, a second element, function, or act could be termed a first element, function, or act, without departing from the scope of the present disclosure.

In addition, phrases such as "processor is configured to" carry out one or more functions or processes, may mean the processor is operatively configured to or operably configured to carry out the functions or processes via software, firmware, and/or wired circuits. For example, a processor that is configured to carry out a function/process may correspond to a processor that is actively executing the software/firmware which is programmed to cause the processor to carry out the function/process and/or may correspond to a processor that has the software/firmware in a memory or storage device that is available to be executed by the processor to carry out the function/process. It should also be noted that a processor that is "configured to" carry out one or more functions or processes, may also correspond to a processor circuit particularly fabricated or "wired" to carry out the functions or processes (e.g., an ASIC or FPGA design). Further the phrase "at least one" before an element (e.g., a processor) that is configured to carry out more than one function may correspond to one or more elements (e.g., processors) that each carry out the functions and may also correspond to two or more of the elements (e.g., processors) that respectively carry out different ones of the one or more different functions.

The term "adjacent to" may mean: that an element is relatively near to but not in contact with a further element; or that the element is in contact with the further portion, unless the context clearly indicates otherwise.

Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

FIG. 15 illustrates an example placement of split lines added for a multi-loop annulus type input face.

DETAILED DESCRIPTION

Figure 1:
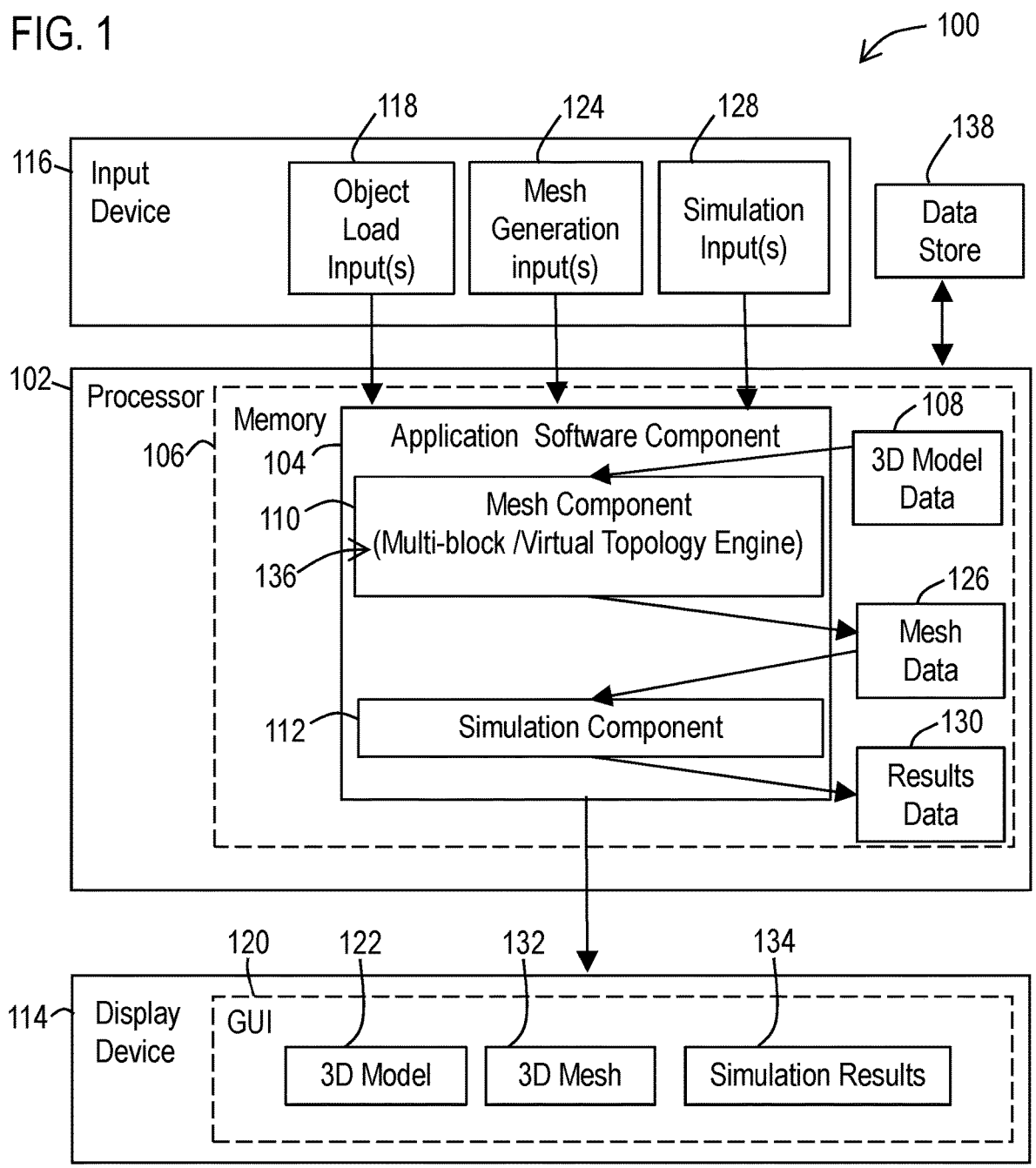
FIG. 1 illustrates a functional block diagram of an example system that facilitates generating meshes for object models.

Various technologies that pertain to systems and methods for generating meshes for object models will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

Many forms of product systems (such as CAE and CAD software) are operative to manipulate and process various types of three dimensional (3D) object models (such as stored in CAD files) that represent a structure for an object (e.g., parts, assemblies and subassemblies). In particular CAE software may be used to carry out testing and/or simulations on object models. Such simulations for example, may include the application of various loads and the calculation of how the structure behaves responsive to such loads based on a generated mesh for the structure. For example, in an example embodiment the simulation software may carry out stress analysis for a structure using a generated mesh for the object model of the structure. In other examples, simulation software may be capable of using meshes to simulate the physical effect of an automobile collision (or other test) on many connected structures represented by object models.

To carry out simulations on a structure, an object model of a structure may undergo a meshing process which divides a surface of the structure into a mesh of many connected four sided geometric shapes. Simulation software may use such meshes, as well as user configurable properties of one or more object models (such as the materials the structures are to be made of) and user configurable analysis parameters, to carry out mathematical processes such as finite element analysis in order to derive information regarding the effects (e.g., physical changes, displacements) that a simulation (e.g., a static load, collision) may have on a structure.

With reference to FIG. 1, an example system 100 that facilitates generating meshes for object models is illustrated. The system 100 may include at least one processor 102 that is configured to execute at least one application software component 104 from a memory 106 in order to carry out the various features described herein. The application software component may be configured (i.e., programmed) to cause the processor to carry out various acts and functions described herein. For example, the application software component may be configured to cause the processor 102 to access 3D object model data 108 from memory and/or some other data store 138 (e.g., file system, PLM database).

The application software component 104 may correspond to and/or include a mesh component 110 that generates a mesh on an object model. Also the application software component may correspond to and/or include a simulation software component 112 (such as CAE software) that may be comprised of one or more software components that include and/or communicate with the mesh component 110 that carries out generating a mesh on an object model.

Further as will be described in more detail below, a mesh software component may be comprised of one or more components that facilitate generation of a mesh. However, it should be appreciated that the features described herein as being carried out by separate components may be carried out by fewer components and/or a single component. Also, features carried out by a single described component may be carried out by two or more software components that communicate with each other.

An example of CAD/CAM/CAE (Computer-aided design/Computer-aided manufacturing/Computer-aided engineering) software that may be adapted to include at least some of the functionality described herein includes the NX suite of applications that is available from Siemens Product Lifecycle Management Software Inc. (Plano, Tex.). However, it should also be understood that the described mesh component may correspond integrated into other types of application software components such as architectural software, animation rendering software, and/or any other 3D software that may use meshes of 3D object models.

The described system may include at least one display device 114 (such as a display screen) and at least one input device 116. For example, the processor may be included as part of a PC, notebook computer, workstation, server, tablet, mobile phone, or any other type of computing system. The display device, for example, may include an LCD display, monitor, and/or a projector. The input devices, for example, may include a mouse, pointer, touch screen, touch pad, drawing tablet, track ball, buttons, keypad, keyboard, game controller, camera, motion sensing device that captures motion gestures, or any other type of input device capable of providing the inputs described herein. Also for devices such as a tablet, the processor 102 may be integrated into a housing that includes a touch screen that serves as both an input and display device. Further, it should be appreciated that some input devices (such as a game controller) may include a plurality of different types of input devices (analog stick, d-pad, and buttons).

Also, it should be noted that the processor described herein may be located in a server that is remote from the display and input devices described herein. In such an example, the described display device and input device may be included in a client device that communicates with the server (and/or a virtual machine executing on the server) through a wired or wireless network (which may include the Internet). In some embodiments, such a client device, for example, may execute a remote desktop application or may correspond to a portal device that carries out a remote desktop protocol with the server in order to send inputs from an input device to the server and receive visual information from the server to display through a display device. Examples of such remote desktop protocols include Teradici's PCoIP, Microsoft's RDP, and the RFB protocol. In such examples, the processor described herein may correspond to a virtual processor of a virtual machine executing in a physical processor of the server.

The described application software component 104 may be configured to be responsive to object loading inputs 118 received through the input device 116 to access the 3D model data 108 and cause the display device 114 to output a graphical user interface (GUI) 120 that displays a visual representation of a 3D object model 122 based on 3D model data 108. Further, the application software component 104 may be configured to be responsive to mesh generation inputs 124 received through the input device to cause the mesh component 110 to generate mesh data 126 based on the loaded 3D model data 108. Such mesh data may also be stored in the data store 138 in correlated relation with the object model data 108 (e.g., CAD data).

In addition, the application software component 104 may be configured to be responsive to simulation inputs 128 received through the input device to cause the simulation component 112 to process the mesh data 126 and produce simulation results data 130. Such simulation results data may correspond to quantitative data regarding the effects of the simulation (stress test, collision) on the structure such as physical changes and displacements. It should also be appreciated that the described application software component 104 may be operative to cause the GUI 120 to display a visual representation 132 of the generated mesh as well as a visual representation 134 of the results of the simulation. Further the described application software component 104 maybe be operative to save such simulation data to the data store 138 in correlated relation with object model data 108.

In surface meshing, for certain simulation applications, a surface mesh comprising well-structured quadrilateral elements may be preferred over a surface mesh comprising triangular elements in order to enhance the accuracy, robustness, and solver convergence rate of the simulations. An example embodiment of the described mesh component 110 may include a multi-block/virtual topology engine 136 (e.g., a software function) that is configured to carry out the generation of a good quality quadrilateral mesh that minimizes and/or eliminates any need to manually refine sub-portions of the mesh (via a finer mesh with denser quadrilateral elements for example).

Figure 2:
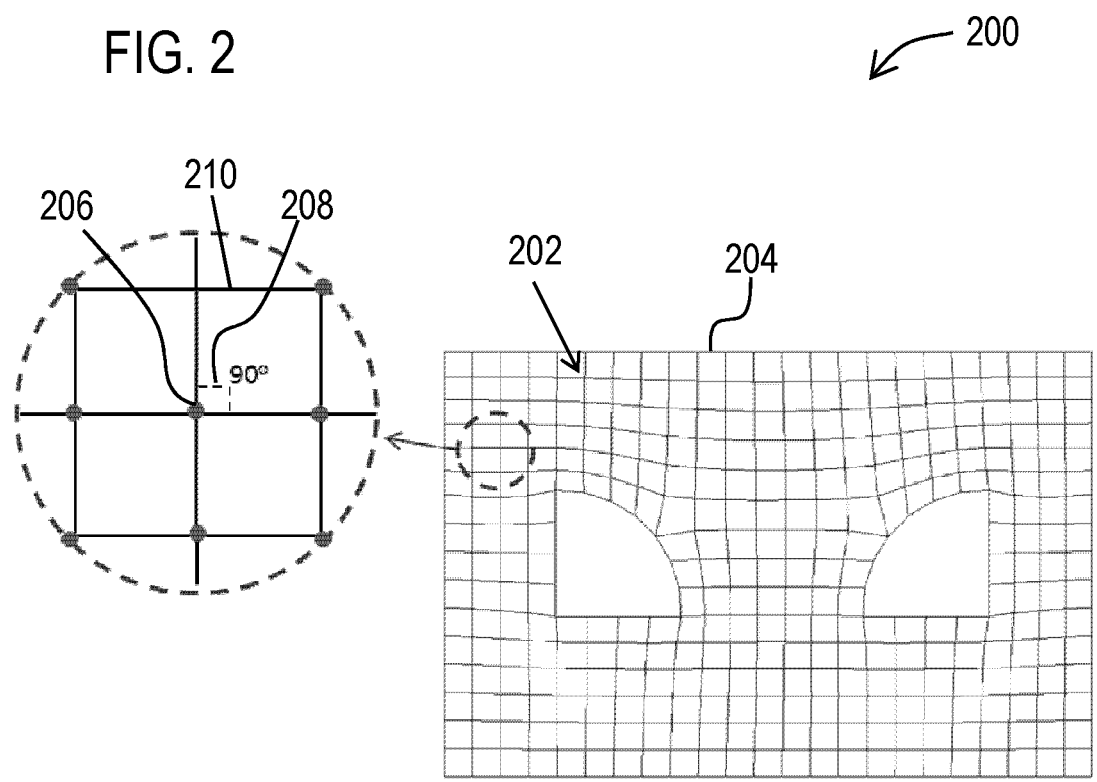
FIG. 2 illustrates an example of a well-structured quadrilateral mesh.

FIG. 2 illustrates an example 200 of such a well-structured quadrilateral mesh 202 of an example multi-loop face 204. As defined herein, a quadrilateral mesh of good quality is defined as a mesh where the majority of interior nodes 206 have a valency (i.e., degree–the number of elements incident to the vertex) of four and each of the four included angles 208 of as many quadrilateral elements 210 as possible (such as at least a majority of them) is substantially 90°, (e.g., 80-100°). To this end, the specific problem that is solved by example embodiments is the automatic generation of such a mesh on general surfaces of industrial parts and components.

Referring back to FIG. 1, an example embodiment of the mesh component 110 may be configured to automatically cause one or more selected faces of the surface for an object model 108 to be processed by the described multi-block virtual topology engine 136. Such an engine 136 may be configured (i.e., programmed) to sub-divide an input face (inputted to the engine 136) into an assortment of maximal convex "blocks" using a niche system of feature-dependent multi-blocking strategies that are selected in order to best achieve the generation of a well-structured quadrilateral mesh.

Figure 3:
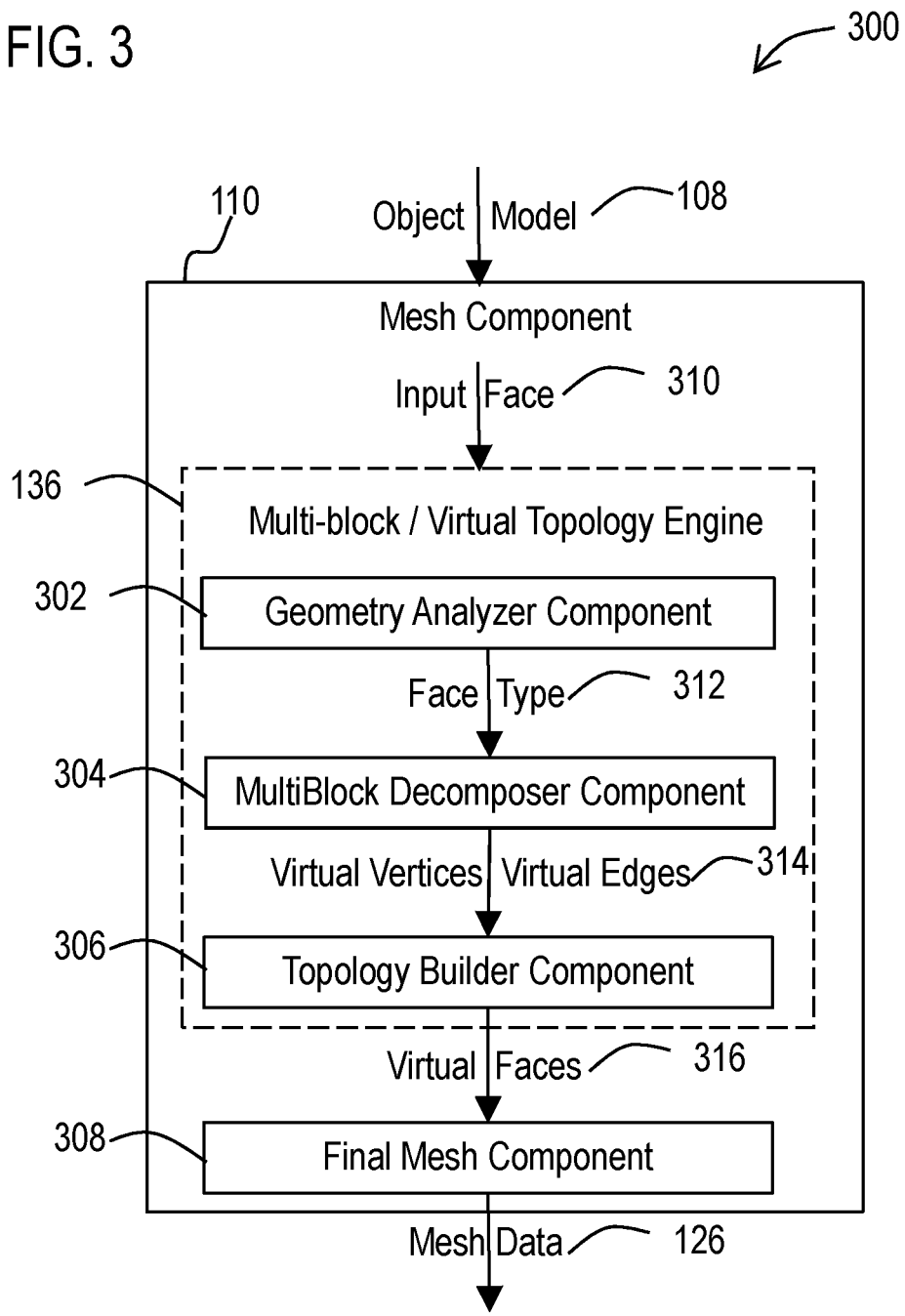
FIG. 3 illustrates an example framework for a mesh component including a multi-block virtual topology engine.

An example framework 300 for the described mesh component 110 and multi-block virtual topology engine 136 is illustrated in FIG. 3. In this example, the engine 136 may be comprised of three tiers of components. A first component 302, which is referred to herein as the geometry analyzer component, may be configured to categorize the type of an input face 310 using a series of topology and/or geometry based feature recognition tools.

This described multi-block virtual topology engine may also include a second component 304, which is referred to herein as a multi-block decomposer component. Such a multi-block decomposer component 304 may be configured to carry out any one of the many different multi-blocking processes (via selectable algorithms) on the input face 310 depending on the face type 312 classified/identified by the geometry analyzer component 302. The output of the multi-block decomposer component (for each of these different multi-blocking processes) may include data representative of block locations across the input face, such as virtual vertices and virtual edges 314 that are usable to determine the block locations.

In addition, the described multi-block virtual topology engine 300 may include a third component 306, which is referred to herein as a topology builder component. Such a topology building component 306 may be configured to determine data representative of virtual faces 316 for a virtual block topology that subdivides the input face 310 into the blocks based on the data (e.g., virtual vertices and virtual edges 314) determined by the multi-block decomposer component 304.

Such virtual faces data 316 produced by the described multi-block virtual topology engine 136 may be passed to a final mesh component 308. Such a final mesh component 308 may be configured to mesh the virtual faces in order to generate structured conformal mesh data 126 across the entire input face 310.

Figure 4:
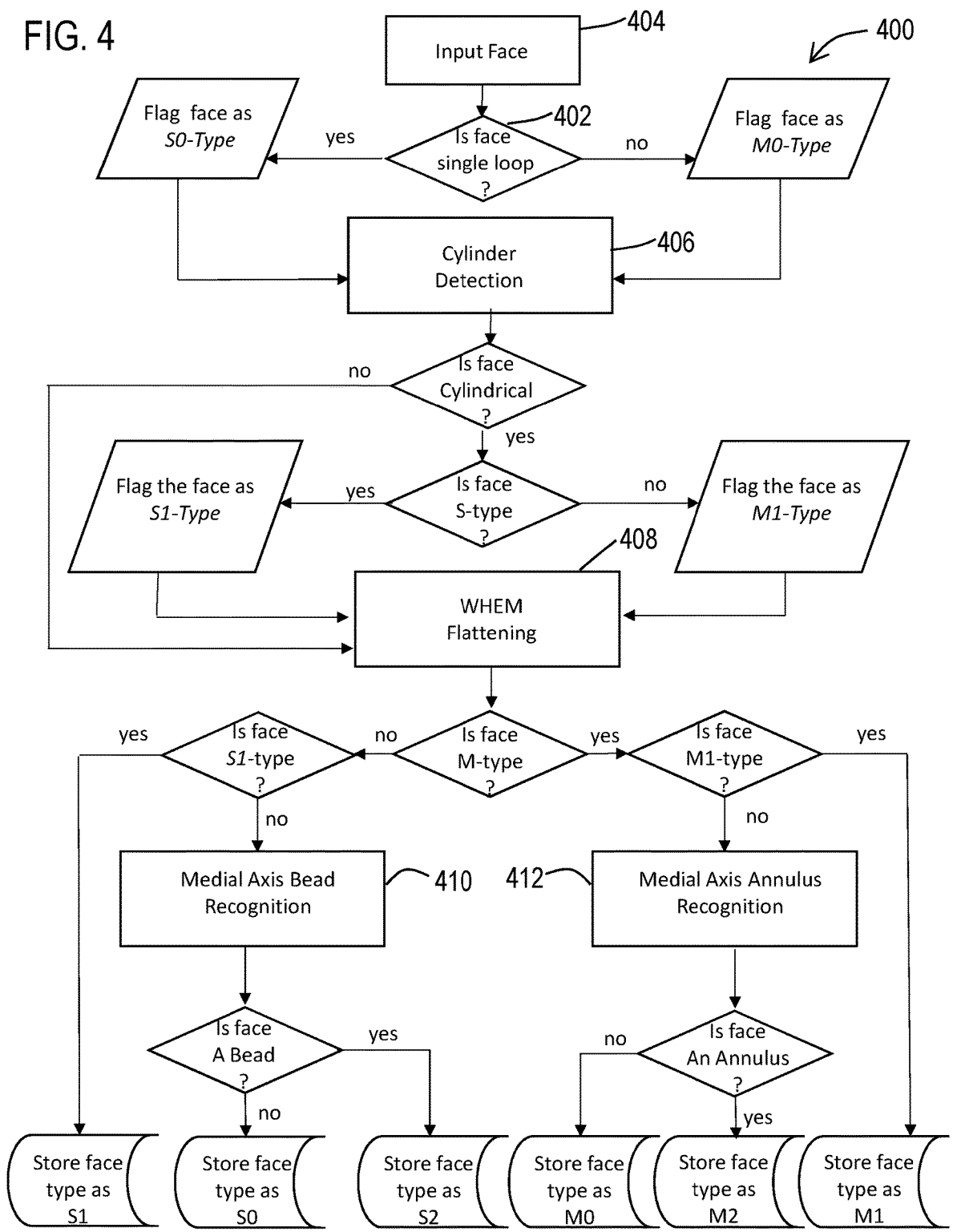
FIG. 4 illustrates an example flow diagram 400 of an example for a geometry analyzer component.

FIG. 4 illustrates a flow diagram 400 of an example workflow (comprised of several steps) that the described geometry analyzer component 302 may carry out to classify surface face types. In this example, in a first step 402, the geometry analyzer component may be configured (e.g., programmed) to categorize an input face 404 based on the number of loops comprised by the input face. A loop for example may correspond to a continuous surface portion that extends around the input face itself or bounds an opening or aperture through the input face. Thus, an input face with no apertures has a single loop, whereas an input face with one or more apertures therethrough has multiple loops.

Figure 5:
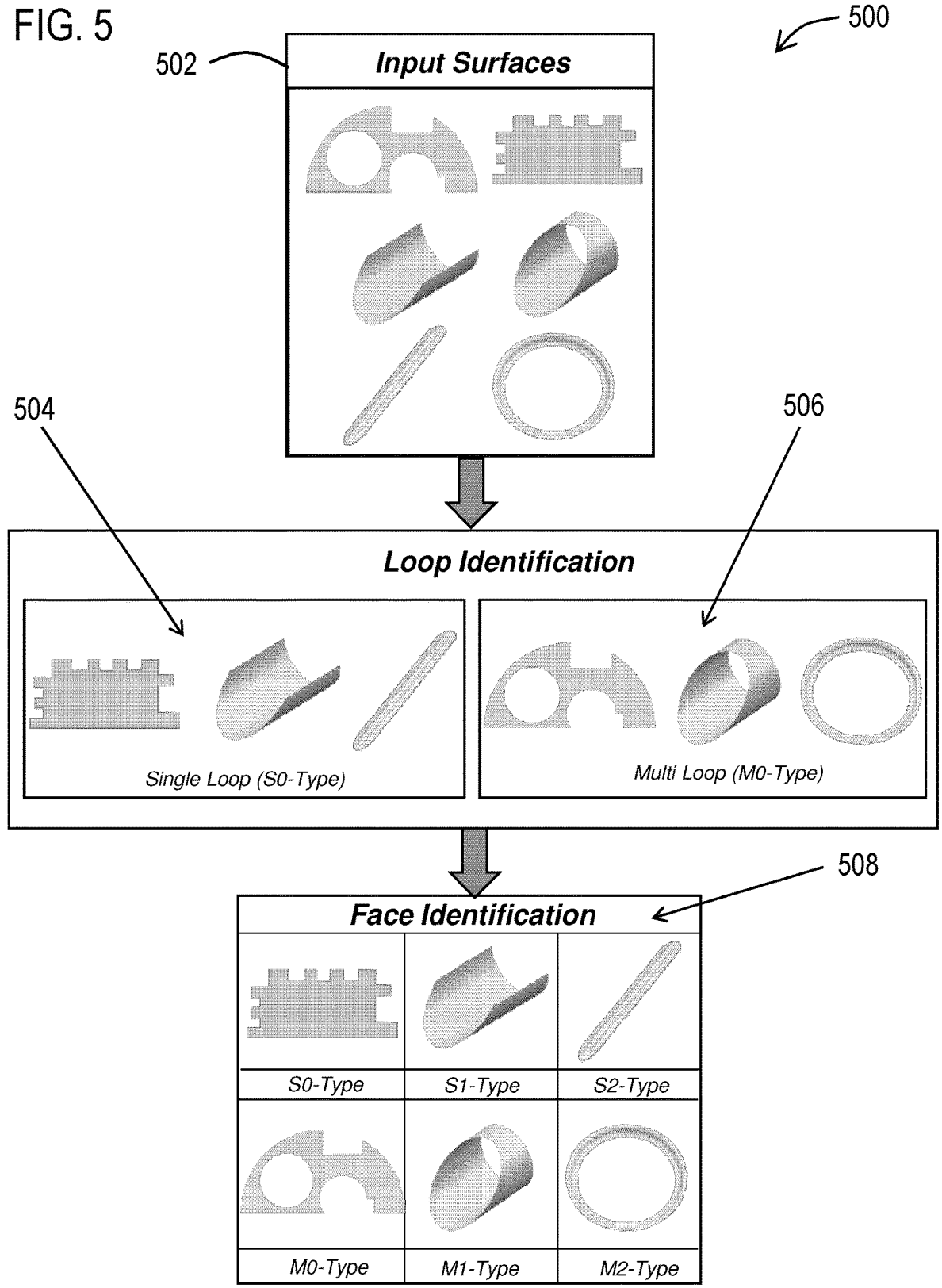
FIG. 5 illustrates examples of input surfaces and corresponding single loop and multi loop classifications.

For example, the geometry analyzer component at the first step 402 may determine whether the input face 404 includes a single loop or multiple loops. In this example, all multi-loop faces may be classified as M0 type faces and all single loop faces may be classified as S0 type faces. FIG. 5 illustrates examples 500 of various input surfaces 502 and corresponding single loop 504 and multi-loop 506 classifications for these various surfaces that may be determined by the described geometry analyzer component.

Depending on the face type determined in the first step 402, different determinations may be made by the geometry analyzer component to further face classification. For example, the geometry analyzer component may carry out a second step 406 in which the geometry analyzer component performs cylinder detection on the input face 404. If an M0 or S0 type face (from the first step) is identified as a cylinder (in the second step), it may be reclassified as an M/or S/type face respectively by the geometry analyzer component.

Figure 6:
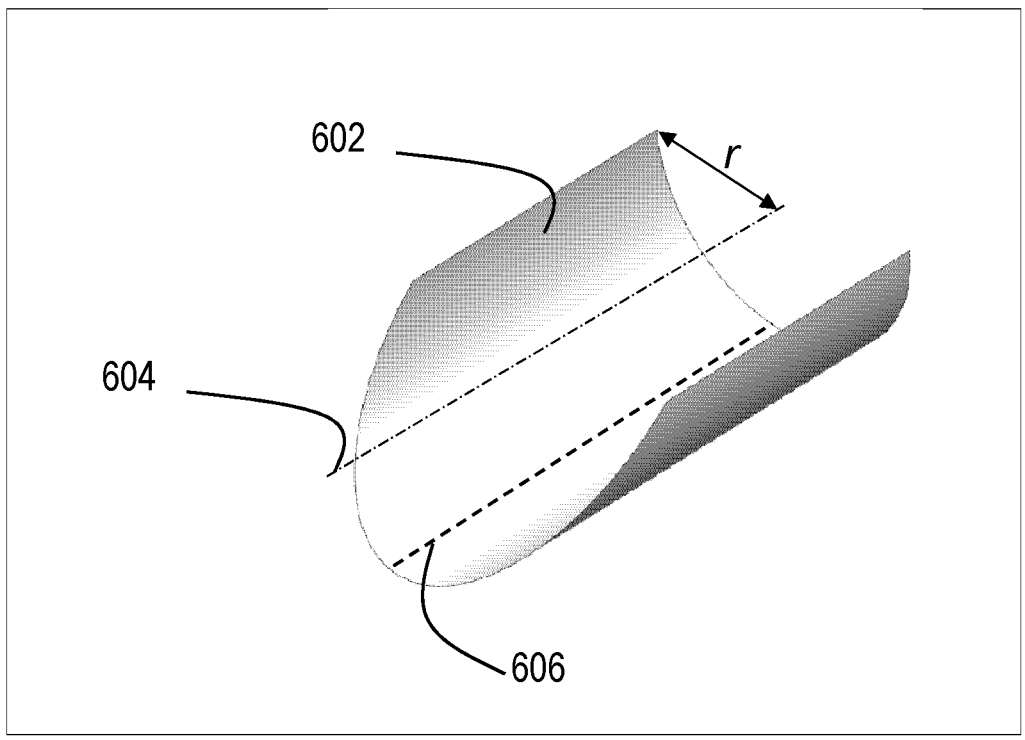
FIG. 6 illustrates an example of features for classifying a cylindrical type input face.

As illustrated in the example 600 of FIG. 6, the geometry analyzer component may be configured to detect a cylindrical surface 602 by solving a best fit axis 604 to the surface 602. If the fit-error to the least square approximation is below a set threshold, then the surface is deemed cylindrical. In example embodiments, the geometry analyzer component may be configured to flag a face as a cylinder based on a determination that all points on a dense sample mesh of the M-type face meets the above criteria within predetermined tolerances.

In addition, to further subsequent processes described herein, the geometry analyzer component may (in addition to categorizing face types) may store in memory (and/or with the CAD data for the surface being analyzed) a corresponding virtual seam edge 606 which is parallel with the cylinder axis 604 of the face for the surface being classified.

Referring back to FIG. 4, the geometry analyzer component may be configured to carry out a third step 408 in which the geometry transforms all faces from 3D space to flattened UV space using the weighted half-edge method (WHEM) flattening algorithm (or other flattening algorithm) to carry out 2D parameterization of a tessellated 3D face. The WHEM flattening algorithm applied to both linear and nonlinear problems uses a compromise between conformal mapping and triangle altitude preservation techniques to generate 2D domains with highly reduced transformational distortion. The further steps and processes described herein related to classification, multi-block decomposing, and meshing may be carried out in this 2D domain and the resulting meshed surface may then be transformed back to 3D space.

For example, the geometry analyzer component may be configured to carry out further face type identification in this 2D domain based on the type of classification carried out in the first and second steps. After flattening in the third step 408, all S0 and M0 (i.e., non-cylindrical) faces may be processed using medial axis recognition to detect bead and annulus features of the faces.

For example, in a fourth step 410, the geometry analyzer component may carry out bead detection for all S0 (i.e., single-loop non-cylindrical) faces. Also for example, in a fifth step 412, the geometry 302 may carry out annulus detection for all M0 (multi-loop non-cylindrical) faces. In this example, any S0 type face which is identified as a bead may be reclassified as an S1 type face. Also any M0 type face which is identified as annulus may be reclassified as an M2 type face.

FIG. 5 illustrates example face identification classifications 508 for the example input surfaces 502 that may be determined by the described geometry analyzer component. However, it should be appreciated that alternative embodiments of the described geometry analyzer component may identify and classify fewer, alternative, and/or additional types of faces.

Figure 7:
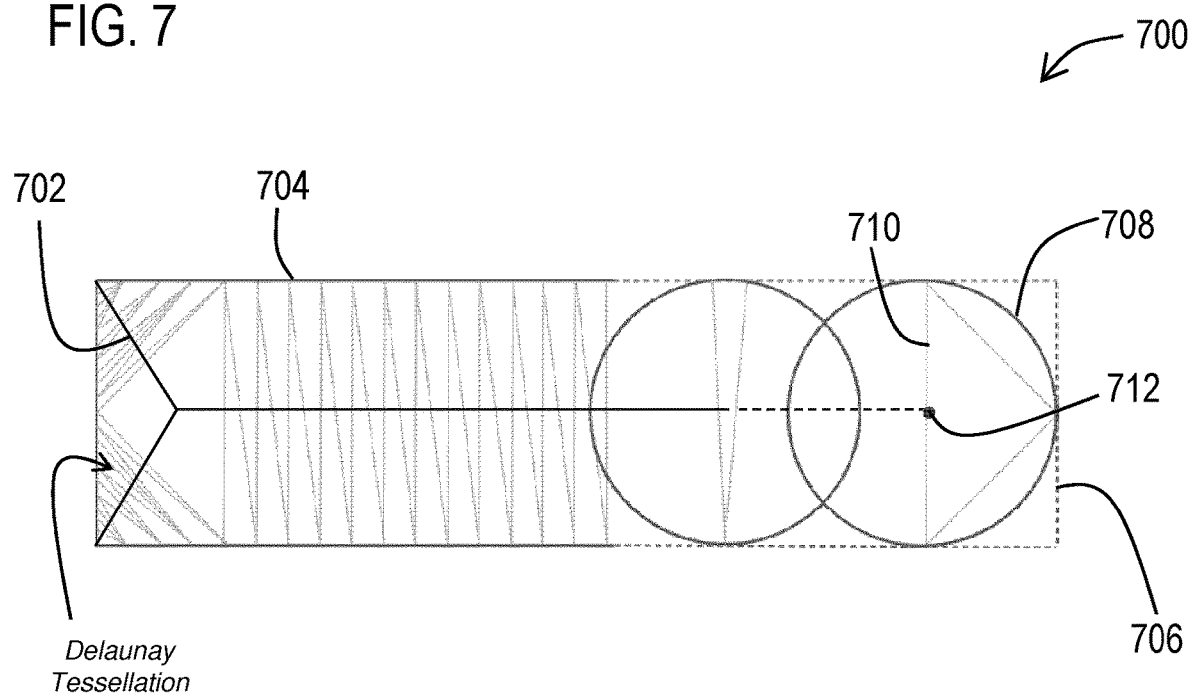
FIG. 7 illustrates an example medial axis determined for an input surface.

With reference to the example surface 700 shown in FIG. 7, in example embodiments the geometry analyzer component may be configured to derive a medial axis 702 of a face 704 in the 2D domain via a Delaunay triangulation of a set of points on the object boundary 706. The Delaunay triangulation of a set of points is defined as a triangulation that has the property that the circumcircle 708 of the three points forming the vertices of each Delaunay triangle 710 contains no other points. The medial axis is traced out by the circumcircle center 712 when the distance between consecutive points on the boundary tends to zero and the circumscribed circle 708 of each Delaunay triangle 710 becomes inscribed within the object, as shown in FIG. 7.

Figure 8:
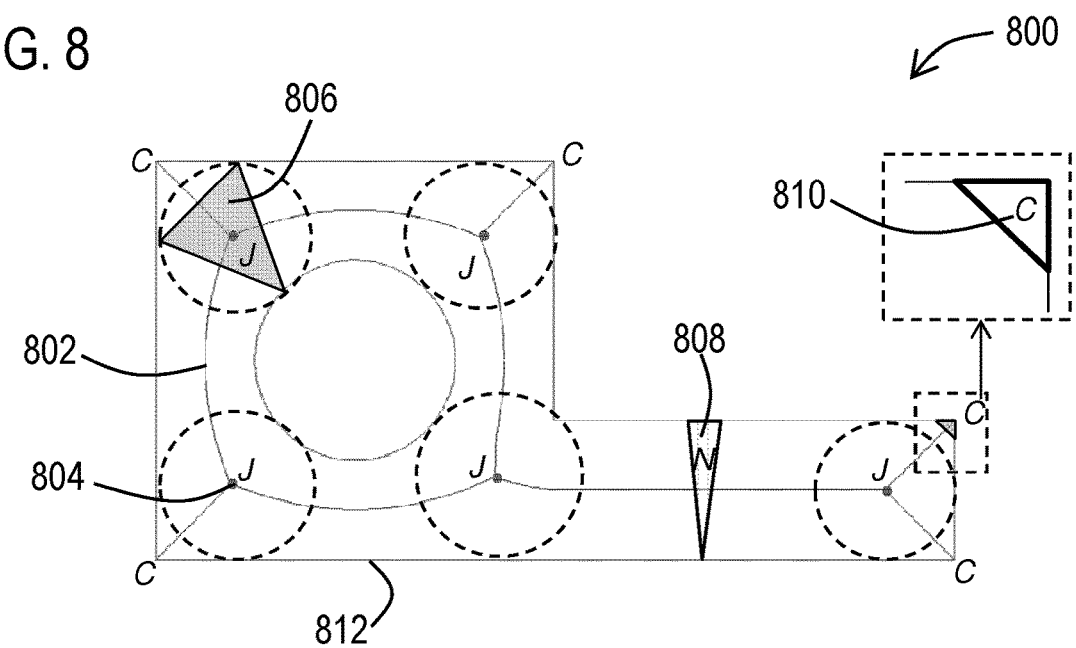
FIG. 8 illustrates medial edges and medial vertices of a medial axis.

With reference to the example 800 illustrated in FIG. 8, there are two entities which make up the medial axis in 2D, namely, medial edges 802 and medial vertices 804. The points on the medial axis which belong to a medial edge are equidistant from two entities on the boundary. Conversely, those which belong to a medial vertex are equidistant from three entities or more on the boundary. Medial edges are connected by medial vertices, as shown in FIG. 8. Medial edges can be classified topologically based on the type of Delaunay triangle from which their connected medial vertices are defined. The three main types of Delaunay triangle may be classified as Junction (J) 806, Normal (N) 808, or Corner (C) 810, having 0, 1 and 2 edges on the object boundary 812 respectively, as shown in FIG. 8. Consequently, a medial edge flanked with medial vertices derived from a J and C type Delaunay triangle would be classified as a J-C medial edge etc.

Figure 9:
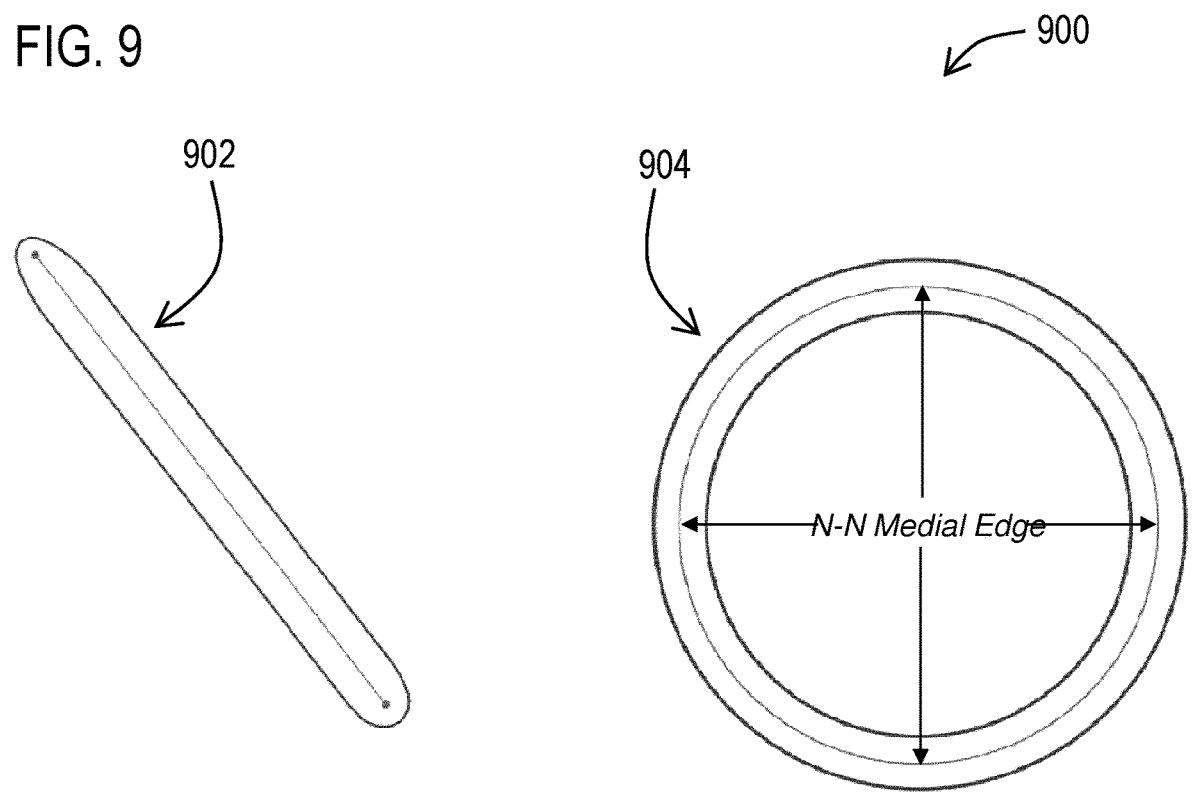
FIG. 9 illustrates example topologies of beads and annuli.

Referring to the examples 900 shown in FIG. 9, the two distinct features which the medial axis may be used by the described geometry analyzer component to detect are medial topologies of beads (S type) 902 and annuli (M type) 904. All beads have a C-C type medial edge. Annuli are special cases where the medial edge has no medial vertices and all axis points are derived from N type Delaunay triangles. This edge may be referred to as an N-N medial edge.

Referring back to FIG. 3, as discussed previously, the multi-block decomposer component selects and carries out a particular multi-block subdivision process on a face (in the 2D domain) based on the particular classifications determined by the geometry analyzer component 302. Such selectable multi-block subdivision processes may include: one or more medial axis decomposition algorithms, a Cartesian slabbing decomposition algorithm, and an Art Gallery decomposition algorithm, based on the particular classification of a face type. However, it should also be appreciated that further alternative embodiments may use fewer, alternative, and/or additional decomposition algorithms based on different classifications of faces carried out by alternative embodiments of the described geometry analyzer component. For example, as will be described in more detail below one of the medial axis decomposition algorithms may be combined with a visibility based decomposition algorithm in order to process relatively complex face curvatures.

Figure 10:
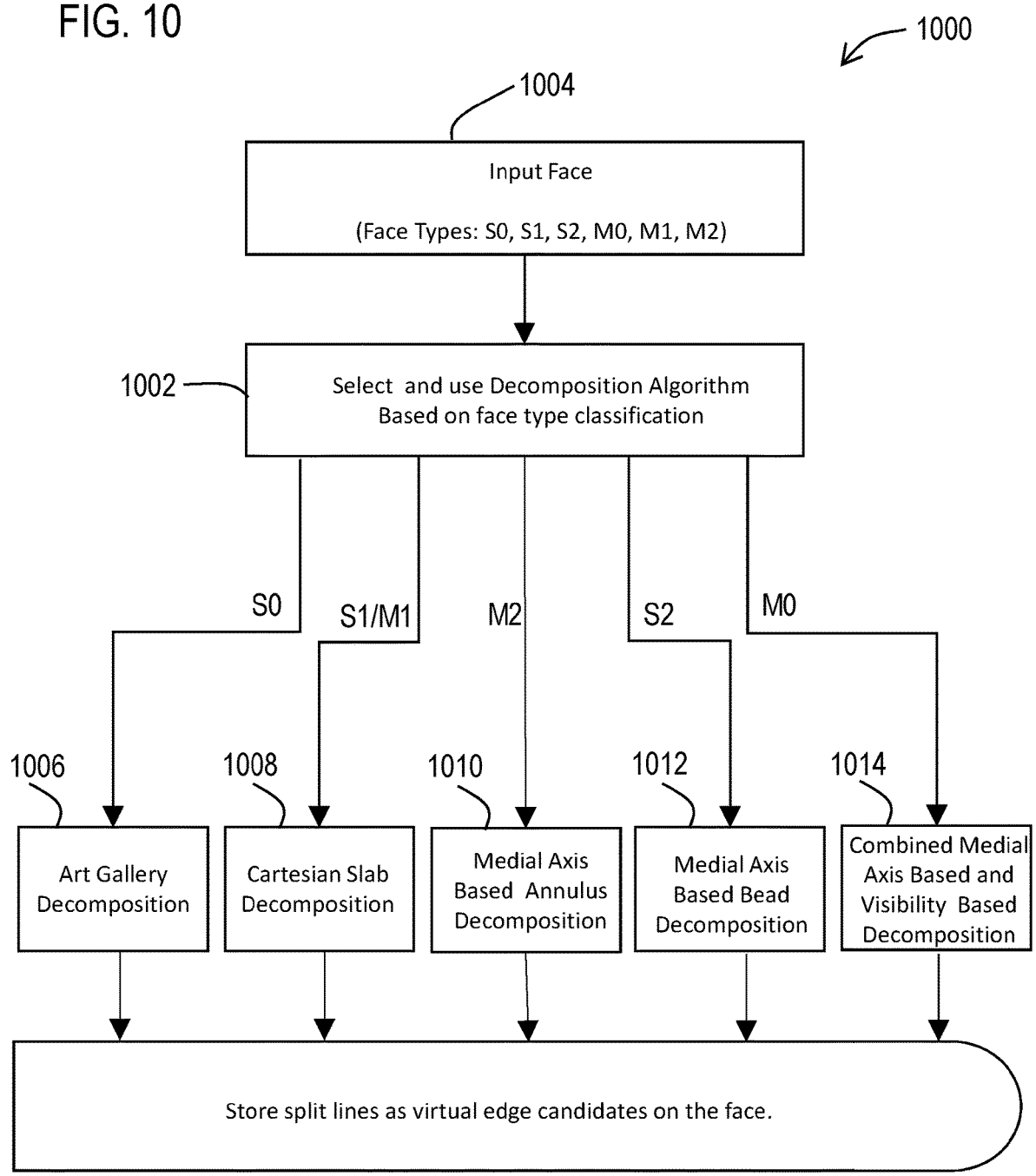
FIG. 10 illustrates a flow diagram for a multi-block decomposer component.

FIG. 10 illustrates a flow diagram 1000 for the functions carried out by the described multi-block decomposer component. In this example, in a first step 1002, the multi-block decomposer component may be configured (e.g., programmed) to select one of the available decomposition algorithms based on the face type classification of an input face 1004 and cause a second step to be carried out in which the selected decomposition algorithm is used to process the input face.

For example, if the face type is an S0 type (i.e., single loop non-bead type), the multi-block decomposer component may cause a second step 1006 to be carried out in which an Art Gallery decomposition algorithm is used to process the input face 1004. Also, if the face type is an S1 or M1 type (i.e., single or multi-loop cylinder type), the multi-block decomposer component may cause an alternative second step 1008 to be carried out in which a Cartesian slab decomposition algorithm is used to process the input face 1004. In addition, if the face type is an M2 type (i.e., multi-loop annulus type), the multi-block decomposer component may cause an alternative second step 1010 to be carried out in which a medial axis based annulus decomposition algorithm is used to process the input face 1004. Further, if the face type is an S2 type (i.e., single loop bead type), the multi-block decomposer component may cause an alternative second step 1012 to be carried out in which a medial axis based annulus decomposition algorithm is used to process the input face 1004. In addition, if the face type is an M0 type (i.e., multi-loop non-cylinder non-annulus type), the multi-block decomposer component may cause an alternative second step 1014 to be carried out in which a medial axis based decomposition algorithm is used in combination with a visibility based decomposition algorithm to process the input face 1004.

Figure 11:
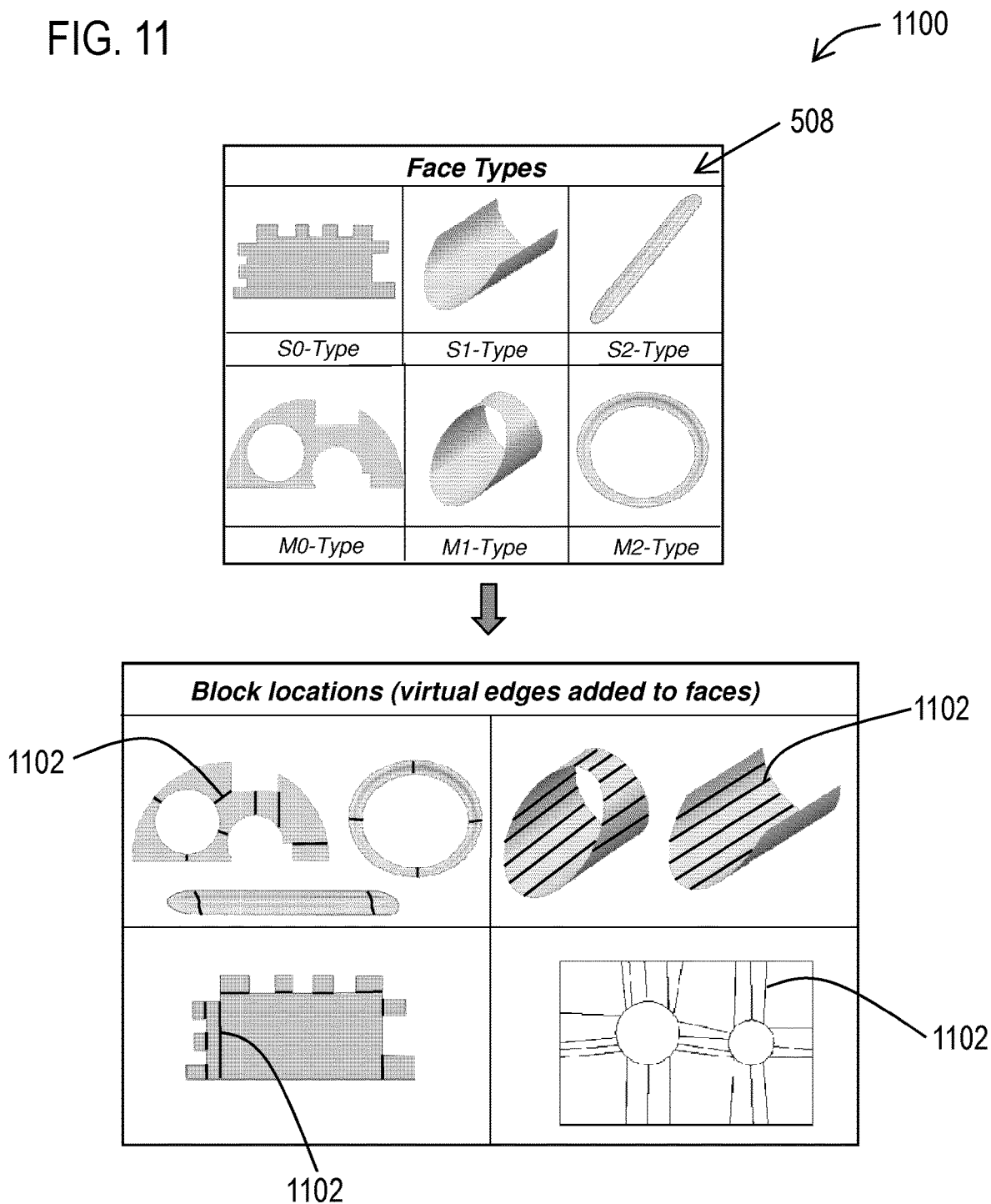
FIG. 11 illustrates examples of virtual edge lines that define blocks that subdivide an input face.

The output of each of these decomposition algorithms may be stored in memory or other data store and may correspond to data representative of block locations defined by lines that split the input face into a number of blocks (i.e., virtual faces) and which lines represent virtual edge candidates on the input face. The data that represents such split lines may include the virtual vertices that define the positions of the virtual edges corresponding to such split lines. FIG. 11 illustrates examples 1100 of these determined virtual edge lines 1102 that subdivide each of the different classified faces described previously with respect to FIG. 5 into a several blocks. However, it should be appreciated that alternative embodiments of the described multi-block decomposer component may place the virtual edge lines in different locations depending on the configuration and parameters associated with the decomposition algorithms described herein. In addition, the following provides a more detailed discussion for how this data may be generated by each of these algorithms.

The described medial axis decomposition algorithms may employ a hybrid technique that uses both circumcenter and triangle height to compute medial axis points. Topology traversal algorithms establish the medial edges. Superfluous medial edges or branches are avoided by analyzing degenerate, flat triangles on the boundary. All associated medial axis attributes of thickness, edge length, touching points are stored with the face. In addition, the touching point information of the inscribed circle is used to define the location of split lines for bead and annulus features. For more complex multi-loop faces, the Delaunay mesh from which the medial axis is derived may be employed to remove concavities and the thickness information from the diameter of the inscribed circle defines the split locations along the medial edge.

Figure 12:
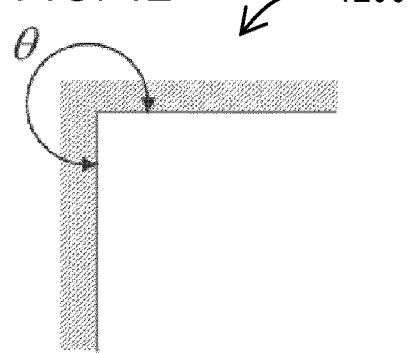
FIG. 12 illustrates an example of concavity at a vertex that is removed via a medial axis decomposition algorithm.

For example, the combined medial axis based and visibility based decomposition algorithm 1014 (shown in FIG. 10) may be applied to input faces classified as M0 type faces (multi-loop non-cylinder and non-annuli type). In the processing of an input face, an initial step for this algorithm may be to remove any concavities from the face. Concavities may be identified by the vertex included angle, θ as illustrated in the example 1200 of FIG. 12. When θ about equals 270° or more this will identify a concavity at a vertex which will be removed when carrying out the algorithm by the described multi-block decomposer component.

Figure 13:
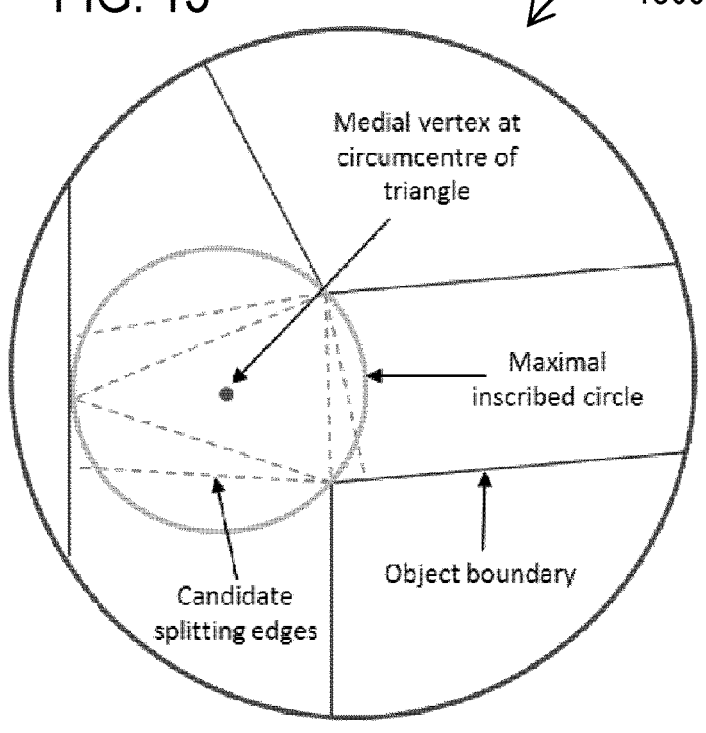
FIG. 13 illustrates an example of Delaunay edges extending from each concavity that may be evaluated via a medial axis decomposition algorithm.

In example embodiments, the Delaunay tessellation of the domain may be carried out by the algorithm to identify concavities at vertices based on this principle. Moreover, triangulation may also be employed to decide upon the optimum splitting of edges to remove the concavity. For example, as illustrated in the example 1300 of FIG. 13, the Delaunay edges extending from each concavity may be determined and evaluated, and the most orthogonal edge 1302 may be selected.

Figure 14:
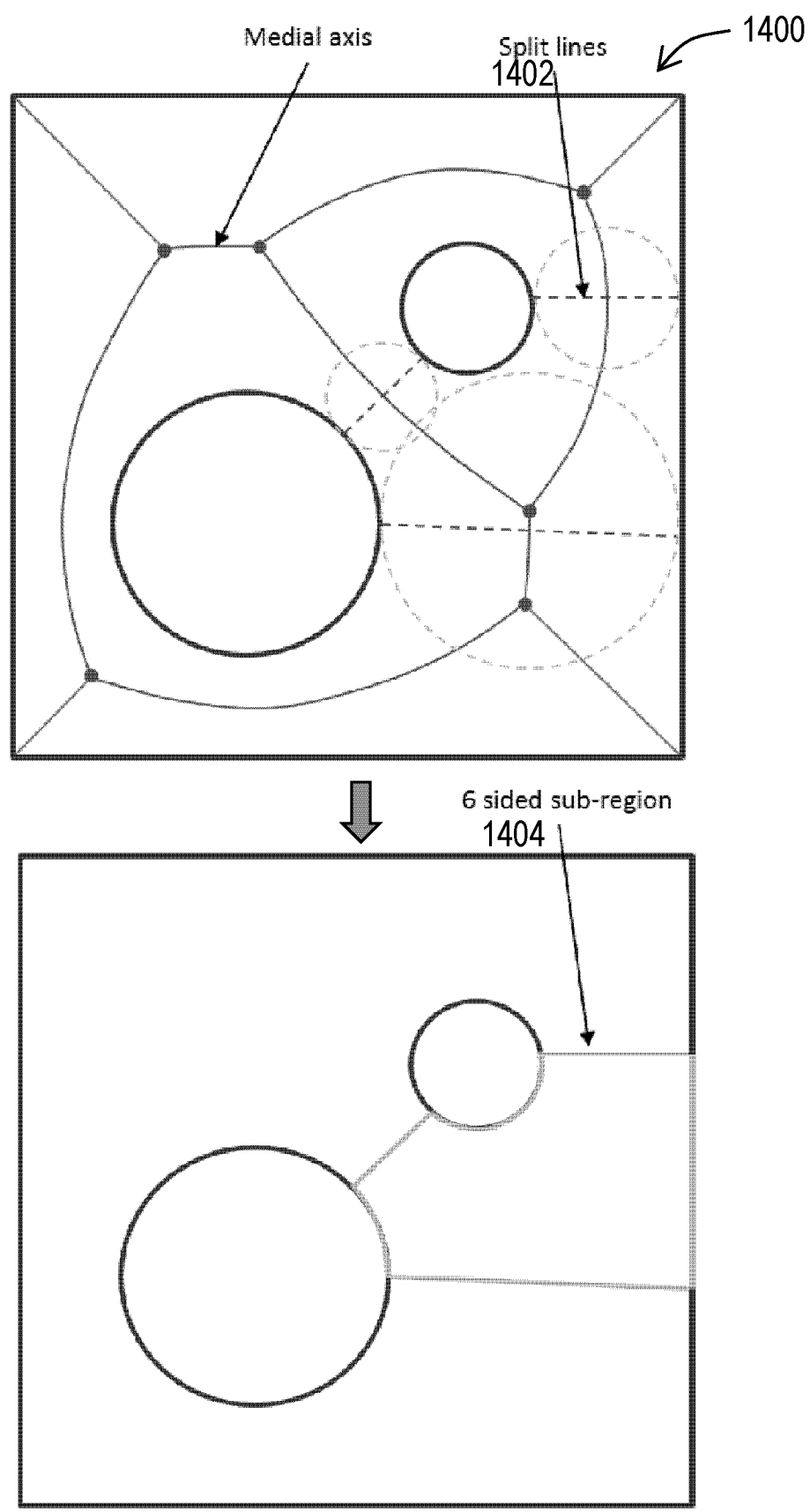
FIG. 14 illustrates an example placement of split lines defined by the touching points of an inscribed circle at positions on each medial edge where the diameter of the circle is either maximum or minimum.

As illustrated in the example shown in FIG. 14, after all concavities have been removed, the next step of this described algorithm may be to place split lines 1402 defined by the touching points of the inscribed circle at positions on each medial edge where the diameter of the circle is either maximum or minimum. In an example embodiment, the most complicated sub-region which may be generated is where all three medial edges surrounding a medial vertex are split to leave a six sided sub-region 1404.

This described medial axis algorithm may be combined with a visibility based decomposition algorithm to provide additional split lines for complex faces. A description of the visibility based decomposition algorithm is described in more detail below with respect to FIGS. 22-24. The split lines generated by the concavity removal, medial axis decomposition and visibility decomposition may then be stored by the multi-block decomposer component as virtual edge candidates on the input face.

Also for example, the annulus medial axis decomposition algorithm 1010 may be applied to input faces classified as M2 type faces (multi-loop annulus type). As illustrated in FIG. 15 for annulus, split lines 1502 defined by the touching points of the inscribed circle 1504 are placed at equidistant intervals on the input face by the multi-block decomposer component to produce a plurality of arched shaped blocks 1506. The number of split lines may be a user configurable parameter of the described application software component in order to configure the granularity of the blocking.

FIG. 15 illustrates an example where the number of split lines 1502 on the input face is 4. Such split lines may produce four four-sided blocks 1504. The determined splits lines may be stored by the multi-block decomposer component as virtual edge candidates on the input face.

Figure 16:
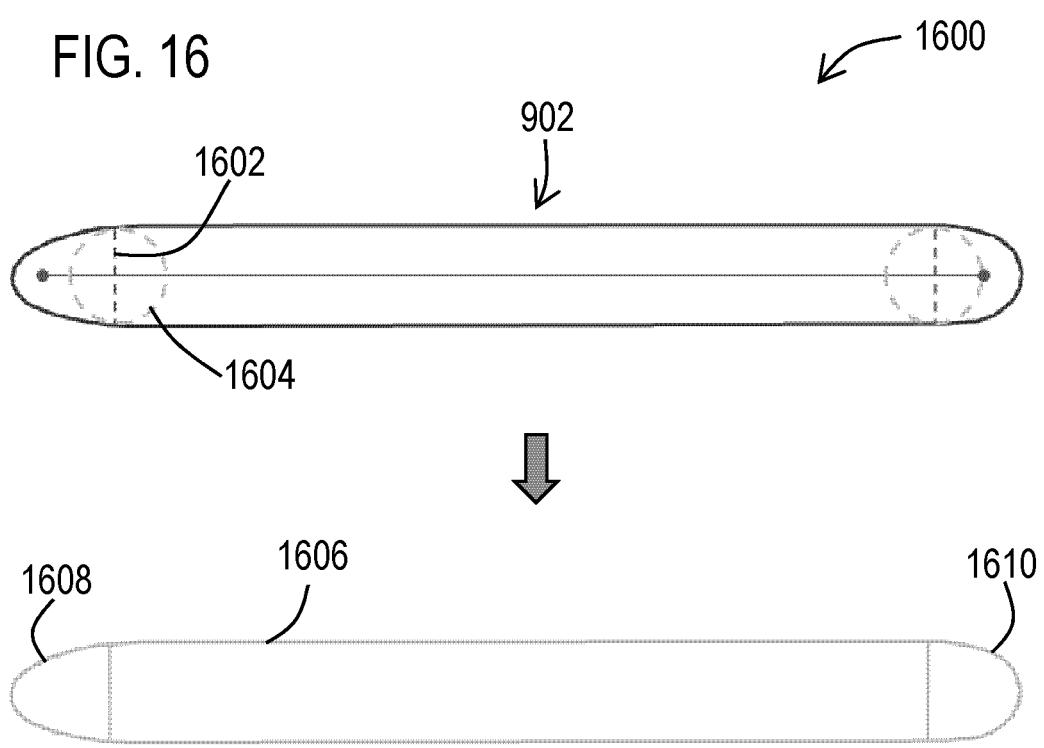
FIG. 16 illustrates an example placement of split lines added for a multi-loop annulus type input face.

In addition, the bead medial axis decomposition algorithm 1012 may be applied to input faces classified as S2 type faces (single-loop bead type). As illustrated in the example 1600 shown in FIG. 16 for a bead, split lines 1602 defined by the touching points of the inscribed circle 1604 may be placed at an offset from the start and end of the medial edge. This defines three blocks including a rectangular portion 1606 in the middle of the bead, flanked by two curved caps 1608, 1610. Such determined split lines may be stored as virtual edge candidates for the input face.

In example embodiments, the Cartesian slab decomposition algorithm may be targeted for use with cylinders and periodic surfaces for which an axis exists. Since the slabs are all parallel to the axis and each other, this algorithm ensures a regular and structured decomposition of thin slabs that can be easily meshed giving a structured look and feel to meshes even if they are not map-meshed. Furthermore, the computation of a best fit axis using a least squares approximation enables not only the recognition of cylindrical features but provides reference data for Cartesian grid alignment used by the Cartesian slab decomposition algorithm.

Figure 17:
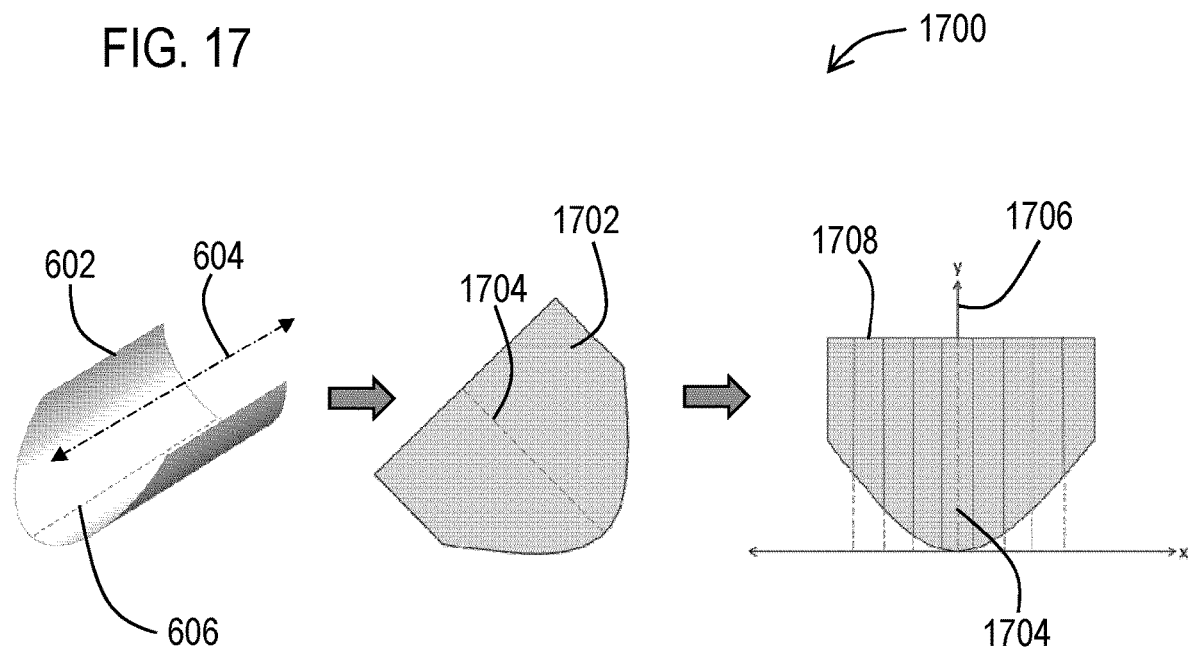
FIG. 17 illustrates an example of flattening and aligning a cylindrical input surface with the orthogonal axes of the global Cartesian (X, Y) coordinate system.

For example, the Cartesian slabbing decomposition algorithm may be applied to input faces classified as S1 and M1 type faces (single-loop and multi-loop cylinder type). As illustrated in the example 1700 shown in FIG. 17, during the flattening of a 3D cylindrical face 602 (carried out by the geometry analyzer component) to 2D space, the 3D to UV transformation is also applied to the virtual seam edge 606 (determined by the geometry analyzer component). The resulting flattened face 1702 and virtual seam edge 1704 will typically occupy a non-axially aligned orientation in 2D UV space.

An initial step carried out via the Cartesian slabbing algorithm may be to apply a transformation to the flattened face 1702 in 2D UV space to align it with the orthogonal axes of the global Cartesian (X, Y) coordinate system. As the virtual seam edge 1704 is aligned with the cylinder axis, the transformation may be computed to align it with the Y axis 1706 of the Cartesian grid. This transform is then applied to the flattened face 1702, thus producing an aligned flattened face 1708 (in which the corresponding cylindrical axis 604 is parallel with the Y axis).

The next stage carried out via the Cartesian slabbing algorithm may be to define the slab shaped blocks which subdivide the face and are parallel to the corresponding cylindrical axis of input face. The number of slab blocks may be a user configurable parameter of the described application software component in order to configure the granularity of the blocking. The slab width may be determined based on the configurable number of slab elements. Split lines may then be generated by computing the intersection between a line extending vertically at each interval defined by the determined slab width and a boundary of the aligned flattened face 1708.

Figure 18:
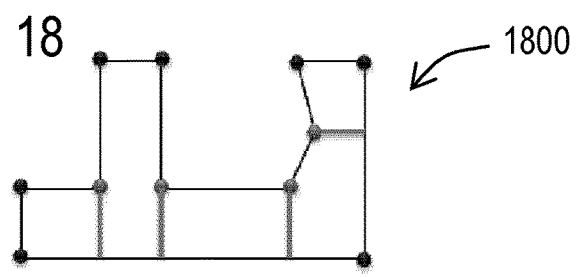
FIGS. 18 and 19 illustrate an example of extending orthogonals to partition an input face via an Art Gallery multi-blocking algorithm.
Figure 19:
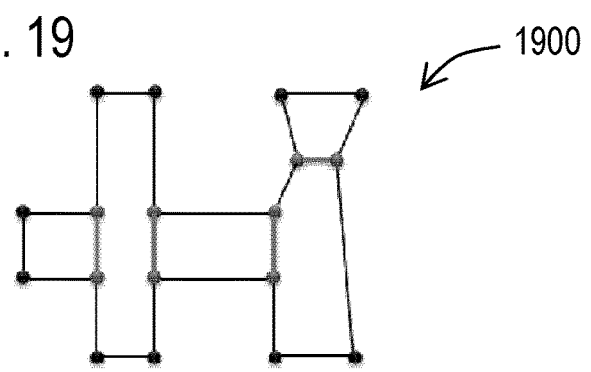

The Art Gallery multi-blocking algorithm, for example, may be employed on faces with single loops. It depends on a coarse boundary discretization and avoids the use of a Delaunay mesh. For example, the art gallery decomposition algorithm may be applied to input faces classified as S0 type faces (single-loop non-cylinder non-bead type). The Art Gallery Theorem (aka Watchman Theorem), provides ground for optimizing the surveillance of art galleries. It states that for a generic, single-loop polygonal floor with n vertices, n/3 floor guards g(n) or surveillance cameras are sometimes necessary and always sufficient. Several lemmas may be used to provide a cheap and smart way to subdivide a non-convex orthogonal polygon into convex orthogonal regions. Orthogonal partitioning of a concave polygon from its reflex vertices can result in convex partitioning of the face. A useable lemma, for any generic polygon with r reflex vertices, can be therefore written as:

$$\frac{r}{2} + 1 \leq A_n \leq r + 1$$

where $A_n$ is the number of resulting convex sub-areas. FIG. 18 shows an example 1800 of how r (4) shortest orthogonals dropped (i.e., extended) from r (4) reflex vertices can partition a polygon into r+1 (5) convex sub-areas. FIG. 19 shows an example 1900 where the minimal condition where r (8) reflex vertices occur opposite to each other and r/2 (4) shortest orthogonals are dropped (extended) to decompose a concave polygon with r (8) vertices into r/2+1(5) convex sub-areas.

Improvising upon and extending this lemma to generic polygons, the described Art Gallery decomposition algorithm may be configured to generate structured meshes by first determining boundary concavities. The input face may be first boundary discretized at a size slightly smaller than a user configurable element size which may correspond to an intended feature size. This means if there are features on the face boundary much smaller than the user configurable element size, the algorithm may be configured to ignore them.

In addition, at each vertex i of the input face (in 3D UV space), the included angle $\varphi_i$ is computed between the node at the vertex and its trailing and leading nodal neighbors. Based on this angle, a vertex is marked as concave or reflex following the rule $$\varphi_i > 270° - \theta_t$$

where $\varphi_t$ is the variable angular tolerance (typically 60°).

Figure 20:
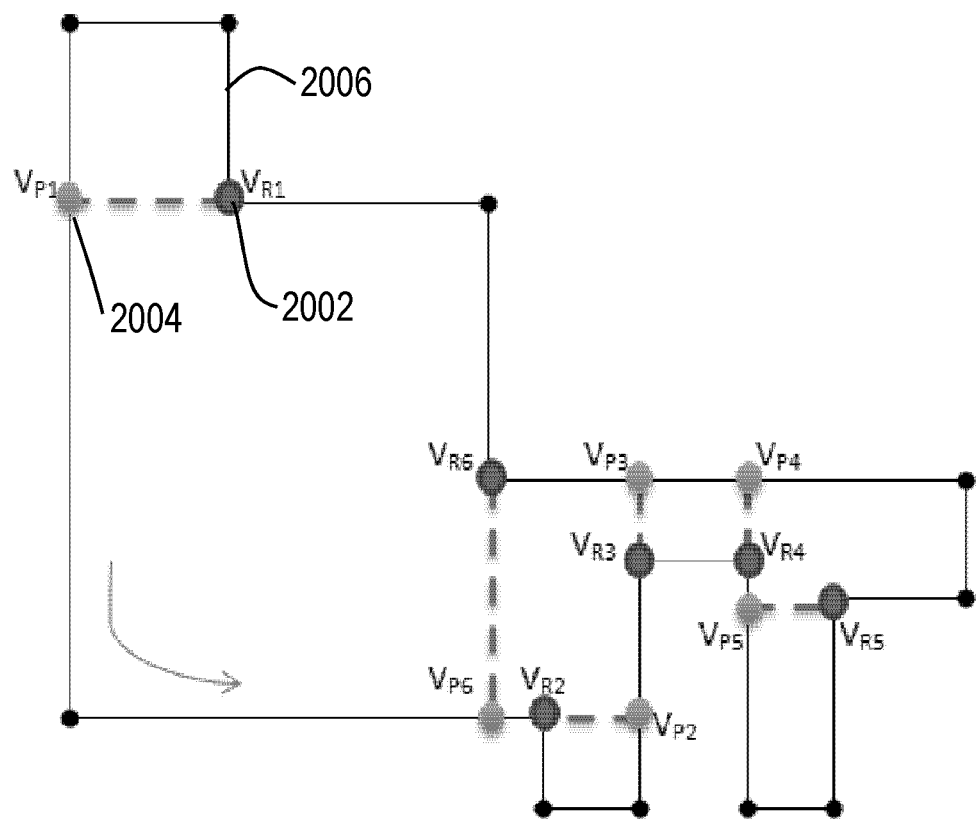
FIG. 20 illustrates a notch diagram which depicts relationships between reflex vertices and their pairs for an input face.

For illustration purposes a notch diagram 2000 is shown in FIG. 20, which depicts relationships between reflex vertices (VR) 2002 and their pair vertices (VP) 2004 for an input face 2006. In order to develop the notch diagram, the face boundary is first discretized at element size and all reflex vertices are first projected orthogonally to their closest neighboring edge.

The art gallery decomposition algorithm may be configured to next establish a relationship between each reflex vertex (VR) and its pair vertex (VP). Some of the reflex vertices can be virtual (VR) and typically most of the pair vertices are virtual ($VP_v$). When all reflex vertexes (VR) are linked with their pair vertex (VP) the notch diagram is complete as shown in FIG. 20. In mathematical notations, the notch diagram (ND) can be expressed as a collection of links between n reflex vertices and their orthogonally projected pair vertices given by:

$$ND = \bigcup_{i=1}^{n}(V_{ri} \mapsto V_{pi})$$

Figure 21:
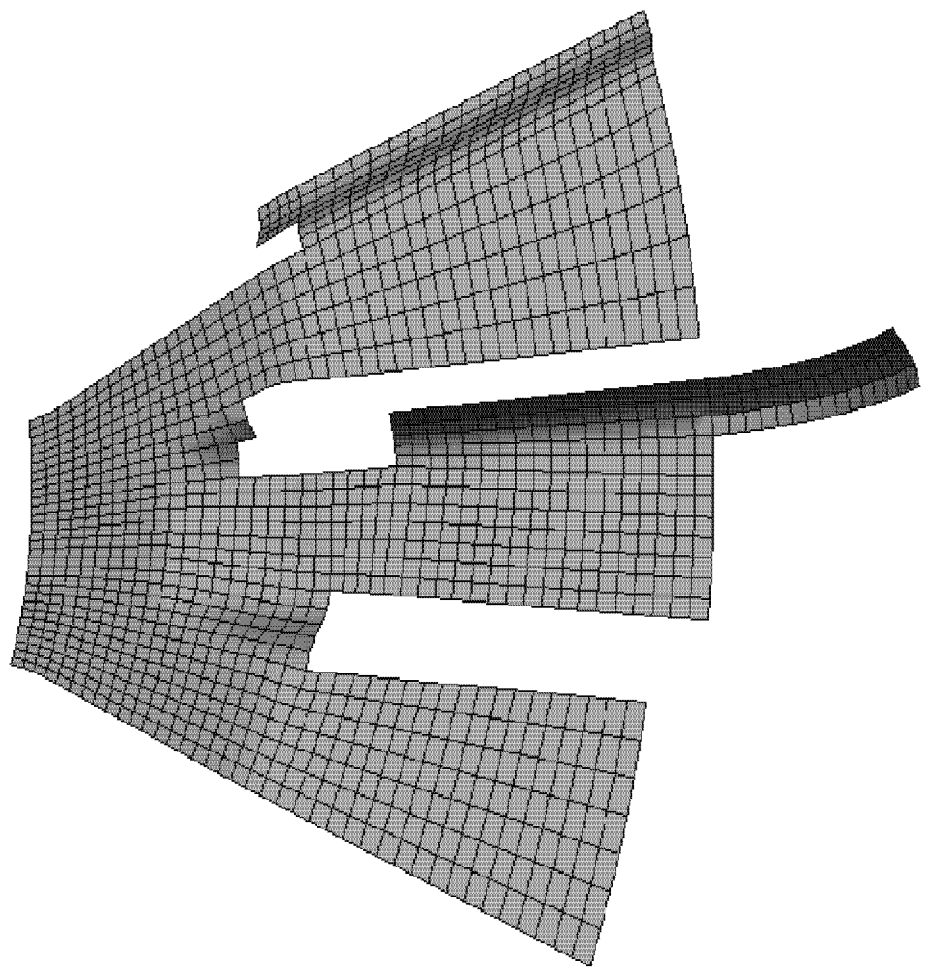
FIG. 21 illustrates a final mesh in 3D space on an Art-Gallery decomposed single loop input face with 9 reflex vertices.

The described art gallery decomposition algorithm may be configured to next use a split line criteria to determine the best split line from each reflex vertex out of the many connection possibilities on the boundary. Once the split lines are put in place, the face has been decomposed into an optimum number of convex sub-regions. An example 2100 of a final result (mesh) in 3D space based on an art-gallery decomposed single loop input face with 9 reflex vertices is shown in FIG. 21.

In a further example embodiment the multi-block decomposer component may also use a visibility based decomposition algorithm on complex input faces. The visibility based decomposition algorithm may be applied to both single and multi-loop faces to append/introduce additional split lines that help breaking down several convex regions into smaller quad-shaped zones for better defined structured mesh generation. In particular, as discussed previously, an example embodiment of the multi-block decomposer component may select and use a combined medial axis based decomposition and visibility based decomposition algorithm for input faces that are classified as multi-loop non-annuli and non-cylindrical (e.g., M0 type input faces)

The described example visibility based decomposition algorithm does not need a Delaunay mesh and depends on a boundary discretization equal to the global size. The visibility based decomposition algorithm determines a "visibility" of a boundary point with respect to other points on the face boundary as illustrated in the example 2200 of FIG. 22. The concave or reflex vertex j 2202 has two lines of extension jl 2204 and jr 2206 that divide the face contour into 3 zones—D1 2208, D2 2210, and D3 2212. The face area to the left of line jl is D1, that to the right of line jr is D3 and the zone is between is D2. Typically, all points in zone D2 are visible to the point j. Each visible point is thus evaluated by means of a split-line functional expressed for like jk 2214 as:

$$\Phi_{jk} = f_{sym}(W_H H + W_L L)$$

Figure 22:
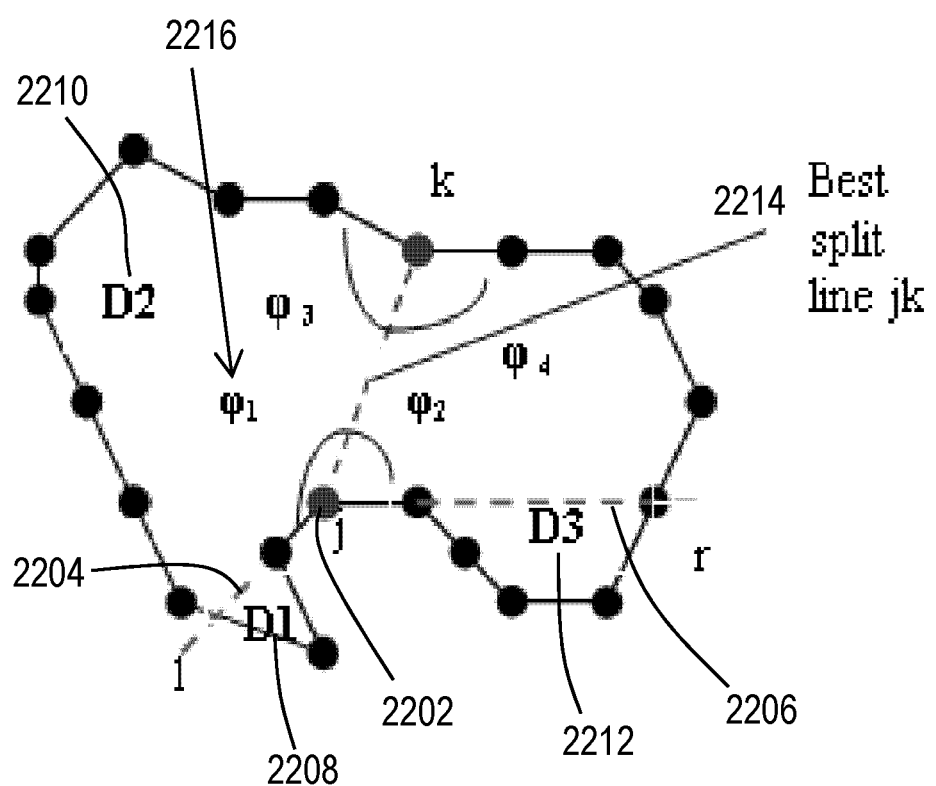
FIG. 22 illustrates an example of a split line added to an input face via the visibility based decomposition algorithm.

The minimum value of the functional of all valid visible split line candidates, gives the best split-line. The normalized length parameter or length cost function L is given by $L = l_{kk}/l_d$; where $l_{jk}$ is the length of the split line jk (as shown in FIG. 22) and $l_d$ is the characteristic length, which is the diagonal of the rectangular box bounding the mesh area B [(xmin,ymin), (xmax, ymax)]. The constant angle and length weight factors are developed heuristically and may correspond to $W_H = 1.0$ and $W_L = 5.0$ for example.

Also, $f_{sym}$ is a split-line symmetry weight factor which is defined as: $f_{sym} = 0.8$ for symmetric split lines; and $f_{sym} = 1.0$ for non-symmetric lines. Further H, or the split-line angle summation term is expressed as:

$$H = \sum_{i=1}^{4} W_{\alpha i} h_i$$

Here the angle weight factors $W_{\alpha i}$ may typically be 1.0 for most angles but may be computed giving more weight to split lines closest to 90 deg. For example, they may be altered to 0.7 and 1.3 as the split lines get close to 90 deg as follows: When $h_1 < 0.033$, $h_2 < 0.033$, $h_3 < 1.0$, and $h_4 < 1.0$, then $W_{\alpha 1} = W_{\alpha 2} = 1.3$ and $W_{\alpha 3} = W_{\alpha 4} = 0.7$; and when $h_1 < 1.0$; $h_2 < 1.0$; $h_3 < 0.033$; $h_4 < 0.033$, then $W_{1\alpha} = W_{2\alpha} = 0.7$ and $W_{\alpha 3} = W_{\alpha 4} = 1.3$.

Here the angle cost functions $h_i$ may be computed in a manner that the better the angle, the lower the value. For quads, this value approaches 0 at 90 deg. Split line angles and very high at angles below 60 deg. They may be expressed as:

$$h_i = 0.5[\{\cos^2\varphi_i \cdot f_\alpha \cdot (1-\cos^2\varphi_i)-1\}+1] | 170° \geq \varphi_i \geq 30°$$

$$h_i = 1 | \varphi_i < 30°; \varphi_i > 170°$$

where the split angles $\varphi_i$ 2216, around the split line 2214 are shown in FIG. 22 and the angle cosine factor $f_\alpha$ can be written as $f_\alpha = 4/\cos^2\varphi_{min}$.

Symmetry of the split-line is measured by proximity of the alternate or corresponding angles. For example, symmetric conditions may correspond to:

$$\varphi_1 \approx \varphi_3 \varphi_2 \approx \varphi_4$$

or $$\varphi_1 \approx \varphi_4 \varphi_2 \approx \varphi_3$$

This example formulation of the split line functional emphasizes orthogonal splitting, symmetry of decomposition and point proximity (shortness of the split lines). As illustrated in FIG. 22, in this example, the best split line 2214 (jk in this case) for the boundary discretized face has the least split line functional value of all possible visible candidates.

The described visibility based decomposition algorithm may be configured such that every time a splitting of the face contour happens, the face contour-loop is split into a sub-loop on the right and one to the left of the split line. Recursive splitting may continue until the resultant sub-contours are "quad-shaped". The example, multi-block decomposer component may use a quad shape check algorithm to test out the sub-contours and determine when the sub-contours are sufficiently "quad-shaped" in order to end the recursive slitting on this portion of the input face.

Figure 23:
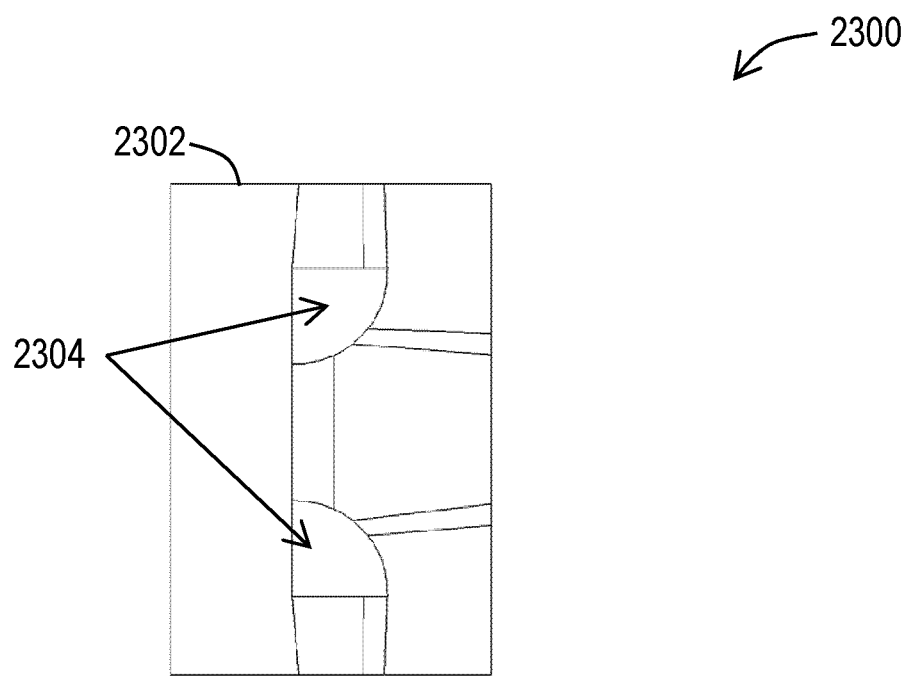
FIG. 23 illustrates an example in which an input face has been split into quad-regions by the visibility based decomposition algorithm.
Figure 24:
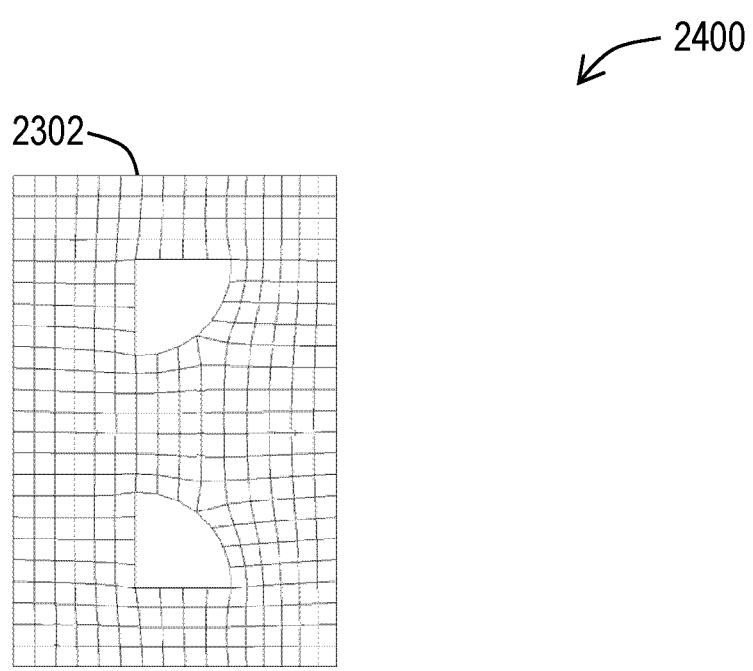
FIG. 24 illustrates an example of the mesh generated on the input face in FIG. 23 after blocks are produced by the visibility based decomposition algorithm.

FIG. 23 illustrates an example 2300 in which an input face 2302 has been split into quad-regions by the described visibility based decomposition algorithm. In this example a face with two inner loops 2304 is decomposed with the visibility based multi-blocking algorithm into 11 virtual quad-shaped faces. FIG. 24 illustrates an example 2400 of this input face 2302 in 2D space after the 11 blocks produced by the visibility based decomposition algorithm have been meshed.

Referring back to FIG. 3, as discussed previously, the multi-block/virtual topology engine 136 of the mesh component 110 may also include the topology builder component 306, which processes the data outputted by the multi-block decomposer component 304. Such data is usable to determine the virtual edge candidates (i.e., split lines) that define blocks that subdivide the input face. The data may include vertex relationships with respect to the 2D representations of the input face, which are usable by the topology builder component to determine the virtual edge candidates and corresponding faces.

Figure 25:
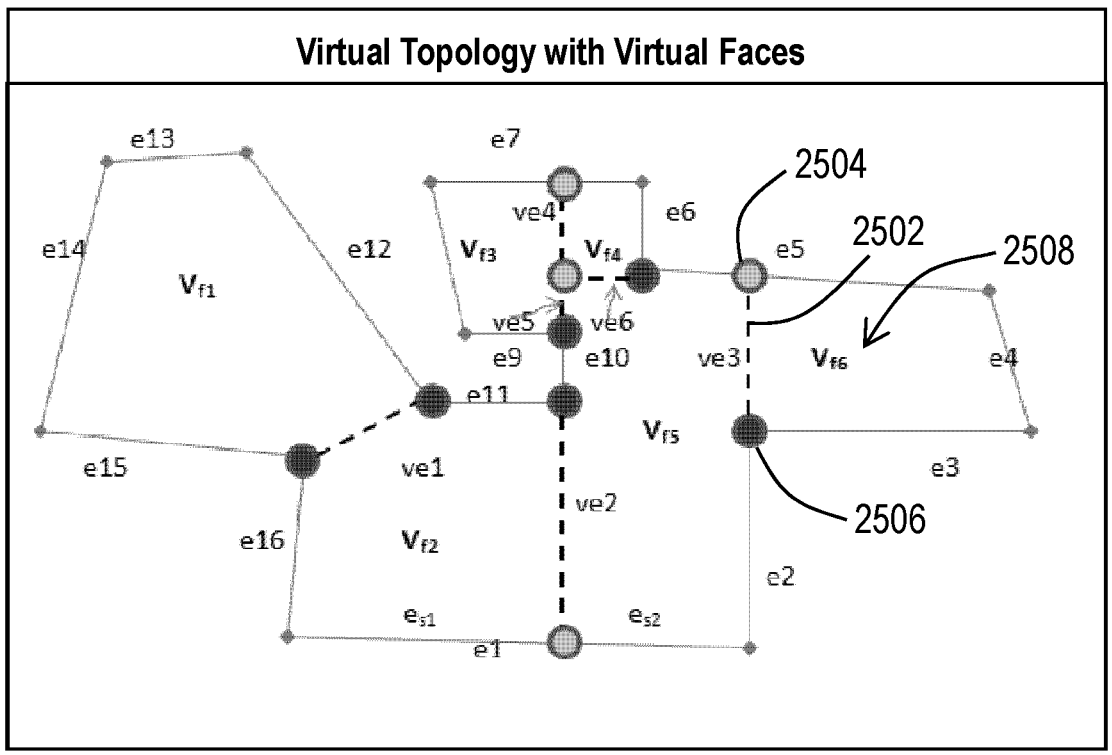
FIG. 25 illustrates an example where a topology builder component generates a virtual topology based on block location data for an input surface.

For example, the topology builder component may be configured to determine a notch diagram (ND) for the outputs from any of the multi-blocking decomposition algorithms described herein. An example of such a notch diagram 2500 for this purpose is illustrated in FIG. 25. The topology builder component may determine the virtual edges (ve) 2502 between linked vertex pairs (e) 2504, 2506. Given the ND, the virtual edges (ve), virtual vertices (e) and the original face geometry, the topology builder component may construct the virtual faces ($V_f$) 2508. All of unused, temporarily generated nodes on the face boundary may be deleted at this point by the topology builder component.

Thus the determined ND in FIG. 25 may correspond to an example of the resulting virtual topology after virtual face decomposition in the 2D parameter space for an input face. It should be appreciated that the described topology builder component may be extremely light-weight, contain minimal data (e.g., mostly pointers/references to nodes/vertices/edges), and may run in the parameter space of the meshing component.

Referring back to FIG. 3, as discussed previously, the mesh component 110 may also include a final mesh component 308 that is configured to generate a final mesh on each of the virtual faces generated by the topology builder component 306. When the final mesh is generated on the virtual faces, the nodes/elements of all virtual faces are associated with the original parent face/edges of the input face and the virtual topology is discarded.

In example embodiments, transfinite meshing is carried out by the final mesh component 308 on the virtual faces first. Such transfinite meshing may be successful on a majority of the virtual faces because they are 4-sided in this example. The remaining non-map-meshable virtual faces may be meshed by a subdivision/paving meshing algorithm. The resulting final mesh may be more structured as a result of the described multi-block decomposition process than what is capable of being produced by a subdivision/paving algorithm on an undecomposed face.

In example embodiments, engineers may use simulation results carried out using the mesh data described herein to modify object models (via CAD software) in order to optimize structures to meet desired performance criteria (e.g., safer automobiles). The final mesh and/or CAD data and/or product data corresponding to the modified structure may be stored in the data store 138 (such as a CAD file and/or a PLM database). The described application software component and/or other software application may then carry out various functions based on the modified structure stored in the CAD data and/or product data.

Such functions may include generating (based on the CAD data and/or product data) engineering drawings and/or a Bill of Material (BOM) that specifies particular components (and quantities thereof) that may be used to build the structure. Such engineering drawings and/or BOM may be printed via a printer on paper, generated in an electronic form such as a Microsoft Excel file or Acrobat PDF file, displayed via a display device, communicated in an e-mail, stored in a data store, or otherwise generated in a form capable of being used by individuals and/or machines to build a product corresponding to the designed structure. Further, it should be appreciated that a machine such as a 3D printer may use data representative of the object model (before or after being modified by CAD software in view of the simulation results) to produce a physical structure (e.g., a part) from the object data.

Figure 26:
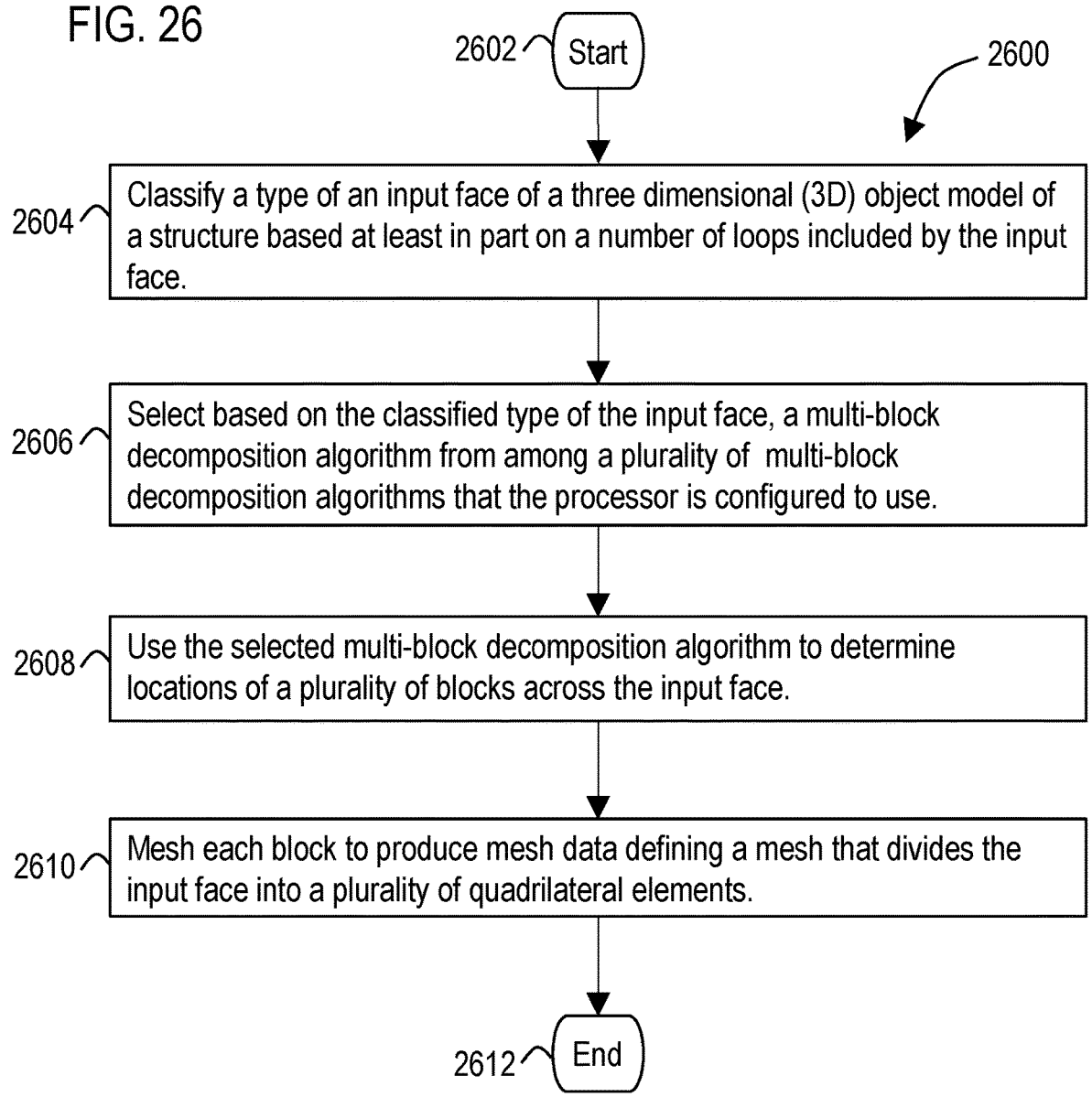
FIG. 26 illustrates a flow diagram of an example methodology that facilitates generating meshes for object models.

With reference now to FIG. 26, various example methodologies are illustrated and described. While the methodologies are described as being a series of acts that are performed in a sequence, it is to be understood that the methodologies may not be limited by the order of the sequence. For instance, some acts may occur in a different order than what is described herein. In addition, an act may occur concurrently with another act. Furthermore, in some instances, not all acts may be required to implement a methodology described herein.

It is important to note that while the disclosure includes a description in the context of a fully functional system and/or a series of acts, those skilled in the art will appreciate that at least portions of the mechanism of the present disclosure and/or described acts are capable of being distributed in the form of computer-executable instructions contained within non-transitory machine-usable, computer-usable, or computer-readable medium in any of a variety of forms, and that the present disclosure applies equally regardless of the particular type of instruction or signal bearing medium or storage medium utilized to actually carry out the distribution. Examples of non-transitory machine usable/readable or computer usable/readable mediums include: ROMs, EPROMs, magnetic tape, floppy disks, hard disk drives, SSDs, flash memory, CDs, DVDs, and Blu-ray disks. The computer-executable instructions may include a routine, a sub-routine, programs, applications, modules, libraries, a thread of execution, and/or the like. Still further, results of acts of the methodologies may be stored in a computer-readable medium, displayed on a display device, and/or the like.

Referring now to FIG. 26, a methodology 2600 that facilitates generating meshes for object models is illustrated. The method may start at 2602 and the methodology may include several acts carried out through operation of at least one processor. These acts may include an act 2604 of classifying a type of an input face of a three dimensional (3D) object model of a structure based at least in part on a number of loops included by the input face. In addition the methodology may include an act 2606 of selecting based on the classified type of the input face, a multi-block decomposition algorithm from among a plurality of multi-block decomposition algorithms that the processor is configured to use. Further the methodology may include an act 2608 of using the selected multi-block decomposition algorithm to determine locations of a plurality of blocks across the input face. In addition, the methodology may include an act 2610 of meshing each block to produce mesh data defining a mesh that divides the input face into a plurality of quadrilateral elements. At 2612 the methodology may end.

It should be appreciated that the methodology 2600 may include other acts and features discussed previously with respect to the system 100. For example, the methodology may include generating a flattened two dimensional (2D) representation of the input face. Classifying the type of the input face may be based on the 2D representation of the input face. Also using the selected multi-block decomposition algorithm to determine locations of the plurality of blocks across the input face may be carried out based on the 2D representation of the input face.

In addition, the act 2604 of classifying the type of the input face for a plurality of input faces may include determining whether: at least one of the input faces includes a single loop or multiple loops; whether at least one of the input faces includes a cylindrical surface; whether at least one of the input faces includes a medial axis bead; and whether at least one of the input faces includes a medial axis annulus.

Further, the acts 2606, 2608 of selecting and using the multi-block decomposition algorithm for a plurality of input faces may include selecting and using a Cartesian slab decomposition algorithm to subdivide at least one of the input faces having a cylindrical surface into several parallel slab shaped blocks that are parallel to the axis of the cylindrical surface.

Also, the acts 2606, 2608 of selecting and using the multi-block decomposition algorithm for a plurality of input faces may include selecting and using at least one medial axis decomposition algorithm including selecting and using at least one of: a medial axis based bead decomposition algorithm; a medial axis bead type decomposition algorithm; and/or a combined medial axis based and visibility based decomposition algorithm. The medial axis based bead decomposition algorithm may be used to subdivide at least one of the input faces having a medial axis bead type input face classification into three blocks which include a rectangular block in the middle of the bead, flanked by two curved block caps. The medial axis bead type decomposition algorithm may be used to subdivide at least one of the input faces having a medial axis annulus type input face classification into the plurality of blocks which include a plurality of arched shaped blocks. Also, the combined medial axis based and visibility based decomposition algorithm may be used to subdivide at least one of the input faces having multi-loop type input face classification based on a determination that the at least one of the input faces is not a cylindrical type input face or a medial axial annuli type input face.

Further, the acts 2606, 2608 may include selecting and using an Art Gallery decomposition algorithm to subdivide at least one of the input faces having a single loop type input face classification based on a determination that the at least one of the input faces is not a cylindrical type input face or a medial axial bead type input face.

In this described methodology, the produced mesh may include interior nodes, where the majority of interior nodes have a valency of four, and where the majority of quadrilateral elements of the mesh have four included angles that are between 80-100°.

Also the described methodology may include an act of determining physical effects on the structure based at least in part on the mesh data and data representative of loads applied to the structure provided through operation of at least one input device. In addition, the methodology may include an act generating at least one graphical user interface (GUI) through a display device, which at least one GUI displays a visual representation of the object model, the mesh for the object model, and the determined physical effects on the structure. Further, the methodology may include an act of responsive to further inputs through the at least one input device, modifying the object model and storing data representative of the modified object model in at least one data store.

As discussed previously, modifications to object models for structures based on simulation results (produced from the meshes described herein) may be persisted as CAD data and/or product data to a CAD file and/or a PLM data store. Acts associated with generating engineering drawings and/or a BOM may then be carried out based on the CAD data or product data. Further, the methodology may include individuals manually building the structure based on the engineering drawings and/or BOM. Further such acts may include a machine (such as a 3D printer) building a structure based on the CAD data.

As discussed previously, acts associated with these methodologies (other than any described manual acts such as an act of manually building a structure) may be carried out by one or more processors. Such processor(s) may be included in one or more data processing systems, for example, that execute software components operative to cause these acts to be carried out by the one or more processors. In an example embodiment, such software components may comprise computer-executable instructions corresponding to a routine, a sub-routine, programs, applications, modules, libraries, a thread of execution, and/or the like. Further, it should be appreciated that software components may be written in and/or produced by software environments/languages/frameworks such as Java, JavaScript, Python, C, C#, C++ or any other software tool capable of producing components and graphical user interfaces configured to carry out the acts and features described herein.

Figure 27:
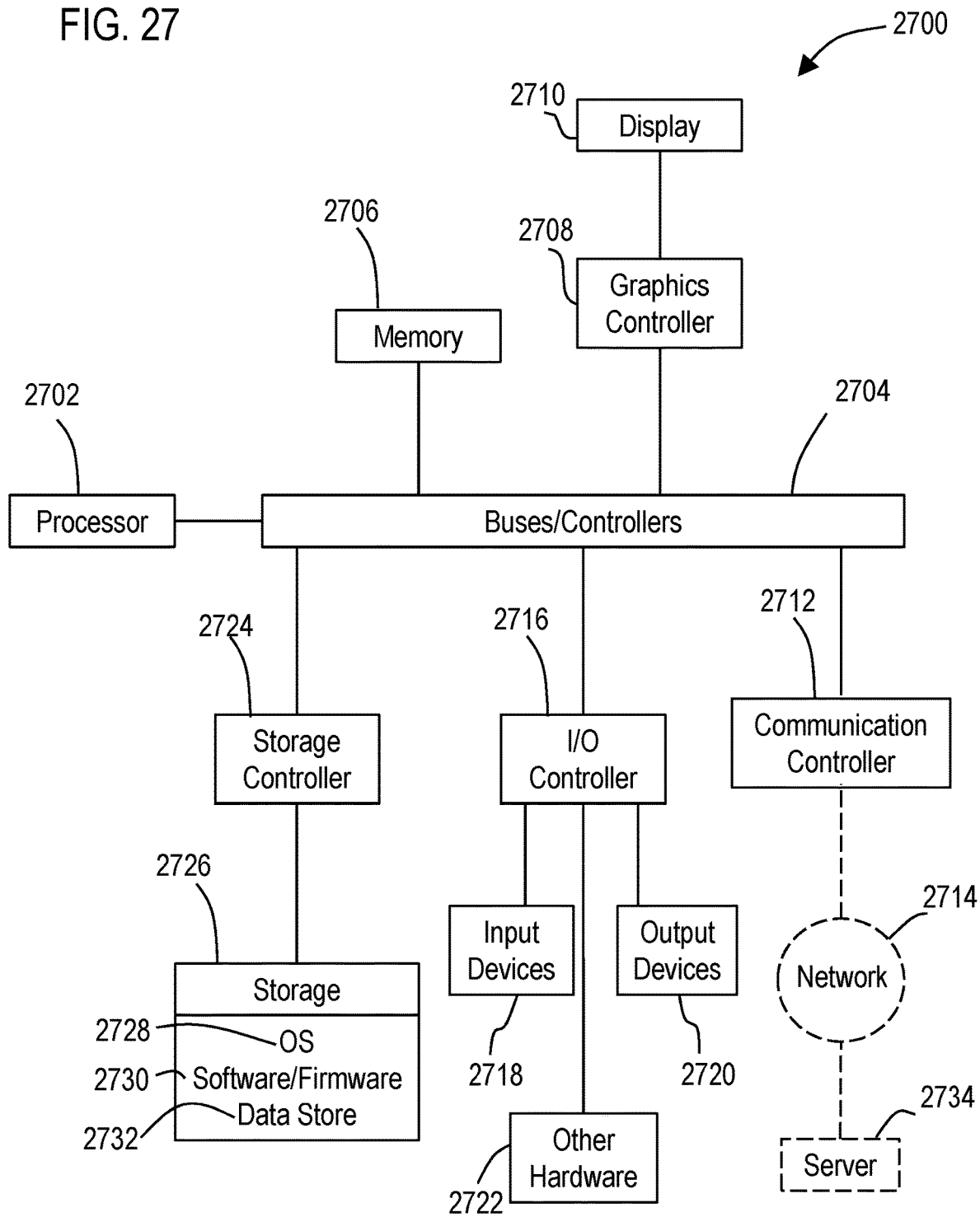
FIG. 27 illustrates a block diagram of a data processing system in which an embodiment can be implemented.

FIG. 27 illustrates a block diagram of a data processing system 2700 (also referred to as a computer system) in which an embodiment can be implemented, for example, as a portion of a CAE CAD, PLM, and/or other system operatively configured by software or otherwise to perform the processes as described herein. The data processing system depicted includes at least one processor 2702 (e.g., a CPU) that may be connected to one or more bridges/controllers/buses 2704 (e.g., a north bridge, a south bridge). One of the buses 2704, for example, may include one or more I/O buses such as a PCI Express bus. Also connected to various buses in the depicted example may include a main memory 2706 (RAM) and a graphics controller 2708. The graphics controller 2708 may be connected to one or more display devices 2710. It should also be noted that in some embodiments one or more controllers (e.g., graphics, south bridge) may be integrated with the CPU (on the same chip or die). Examples of CPU architectures include IA-32, x86-64, and ARM processor architectures.

Other peripherals connected to one or more buses may include communication controllers 2712 (Ethernet controllers, WiFi controllers, cellular controllers) operative to connect to a local area network (LAN), Wide Area Network (WAN), a cellular network, and/or other wired or wireless networks 2714 or communication equipment.

Further components connected to various busses may include one or more I/O controllers 2716 such as USB controllers, Bluetooth controllers, and/or dedicated audio controllers (connected to speakers and/or microphones). It should also be appreciated that various peripherals may be connected to the USB controller (via various USB ports) including input devices 2718 (e.g., keyboard, mouse, touch screen, trackball, gamepad, camera, microphone, scanners, motion sensing devices), output devices 2720 (e.g., printers, speakers) or any other type of device that is operative to provide inputs or receive outputs from the data processing system. Further it should be appreciated that many devices referred to as input devices or output devices may both provide inputs and receive outputs of communications with the data processing system. Further it should be appreciated that other peripheral hardware 2722 connected to the I/O controllers 2716 may include any type of device, machine, or component that is configured to communicate with a data processing system.

Additional components connected to various busses may include one or more storage controllers 2724 (e.g., SATA). A storage controller may be connected to a storage device 2726 such as one or more storage drives and/or any associated removable media, which can be any suitable non-transitory machine usable or machine readable storage medium. Examples, include nonvolatile devices, volatile devices, read only devices, writable devices, ROMs, EPROMs, magnetic tape storage, floppy disk drives, hard disk drives, solid-state drives (SSDs), flash memory, optical disk drives (CDs, DVDs, Blu-ray), and other known optical, electrical, or magnetic storage devices drives and/or computer media. Also in some examples, a storage device such as an SSD may be connected directly to an I/O bus 2704 such as a PCI Express bus.

A data processing system in accordance with an embodiment of the present disclosure may include an operating system 2728, software/firmware 2730, and data stores 2732 (that may be stored on a storage device 2726 and/or the memory 2706). Such an operating system may employ a command line interface (CLI) shell and/or a graphical user interface (GUI) shell. The GUI shell permits multiple display windows to be presented in the graphical user interface simultaneously, with each display window providing an interface to a different application or to a different instance of the same application. A cursor or pointer in the graphical user interface may be manipulated by a user through a pointing device such as a mouse or touch screen. The position of the cursor/pointer may be changed and/or an event, such as clicking a mouse button or touching a touch screen, may be generated to actuate a desired response. Examples of operating systems that may be used in a data processing system may include Microsoft Windows, Linux, UNIX, iOS, and Android operating systems. Also, examples of data stores include data files, data tables, relational database (e.g., Oracle, Microsoft SQL Server), database servers, or any other structure and/or device that is capable of storing data which is retrievable by a processor.

The communication controllers 2712 may be connected to the network 2714 (not a part of data processing system 2700), which can be any public or private data processing system network or combination of networks, as known to those of skill in the art, including the Internet. Data processing system 2700 can communicate over the network 2714 with one or more other data processing systems such as a server 2734 (also not part of the data processing system 2700). However, an alternative data processing system may correspond to a plurality of data processing systems implemented as part of a distributed system in which processors associated with several data processing systems may be in communication by way of one or more network connections and may collectively perform tasks described as being performed by a single data processing system. Thus, it is to be understood that when referring to a data processing system, such a system may be implemented across several data processing systems organized in a distributed system in communication with each other via a network.

Further, the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely.

In addition, it should be appreciated that data processing systems may be implemented as virtual machines in a virtual machine architecture or cloud environment. For example, the processor 2702 and associated components may correspond to a virtual machine executing in a virtual machine environment of one or more servers. Examples of virtual machine architectures include VMware ESCi, Microsoft Hyper-V, Xen, and KVM.

Those of ordinary skill in the art will appreciate that the hardware depicted for the data processing system may vary for particular implementations. For example, the data processing system 2700 in this example may correspond to a computer, workstation, and/or a server. However, it should be appreciated that alternative embodiments of a data processing system may be configured with corresponding or alternative components such as in the form of a mobile phone, tablet, controller board or any other system that is operative to process data and carry out functionality and features described herein associated with the operation of a data processing system, computer, processor, and/or a controller discussed herein. The depicted example is provided for the purpose of explanation only and is not meant to imply architectural limitations with respect to the present disclosure.

As used herein, the terms "component" and "system" are intended to encompass hardware, software, or a combination of hardware and software. Thus, for example, a system or component may be a process, a process executing on a processor, or a processor. Additionally, a component or system may be localized on a single device or distributed across several devices.

Also, as used herein a processor corresponds to any electronic device that is configured via hardware circuits, software, and/or firmware to process data. For example, processors described herein may correspond to one or more (or a combination) of a microprocessor, CPU, FPGA, ASIC, or any other integrated circuit (IC) or other type of circuit that is capable of processing data in a data processing system, which may have the form of a controller board, computer, server, mobile phone, and/or any other type of electronic device.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 2700 may conform to any of the various current implementations and practices known in the art.

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, act, or function is an essential element which must be included in the claim scope: the scope of patented subject matter is defined only by the allowed claims. Moreover, none of these claims are intended to invoke 35 USC § 272(f) unless the exact words "means for" are followed by a participle.

What is claimed is:

1. A method comprising:
through operation of at least one processor:
classifying a type of an input face of a three-dimensional (3D) object model of a structure based at least in part on a number of loops included by the input face, wherein classifying comprises, for a given input face:
determining whether the input face includes a single loop or multiple loops;
determining whether the input face includes a cylindrical surface;
responsive to a determination that the input face includes a cylindrical surface, classifying the input face as a cylindrical type; and
responsive to a determination that the input face does not include a cylindrical surface:

classifying the input face as a multiple-loop annulus type responsive to identification of the input face as an annulus through medial annulus recognition;

classifying the input face as a multiple-loop non-annulus type responsive to identification of the input face as not an annulus through medial annulus recognition;

classifying the input face as a single loop bead type responsive to identification of the input face as a bead through medial bead detection; and classifying the input face as a single loop non-bead type responsive to an identification of the input face as not a bead through medial bead detection; and selecting, based on the classified type of the input face, a multi-block decomposition algorithm from among a plurality of multi-block decomposition algorithms that the processor is configured to use, wherein the selected multi-block decomposition algorithm differs between each of the cylindrical type, the multiple-loop annulus type, multiple-loop non-annulus type, the single loop bead type, and the single loop non-bead type;

using the selected multi-block decomposition algorithm to determine locations of a plurality of blocks across the input face; and meshing each block to produce mesh data defining a mesh that divides the input face into a plurality of quadrilateral elements.

2. The method according to claim 1, further comprising, through operation of the at least one processor:

generating a flattened two-dimensional (2D) representation of the input face, wherein classifying the type of the input face is based on the 2D representation of the input face, wherein using the selected multi-block decomposition algorithm to determine locations of the plurality of blocks across the input face is carried out based on the 2D representation of the input face.

3. The method according to claim 2, wherein selecting and using the multi-block decomposition algorithm comprises selecting and using a Cartesian slab decomposition algorithm, when the classified type of the input face is the cylindrical type, to subdivide into a several parallel slab shaped blocks that are parallel to the axis of a cylindrical surface of the input face.

4. The method according to claim 2, wherein selecting and using comprises:

selecting and using a medial axis-based bead decomposition algorithm, when the classified type of the input face is the single loop bead type, to subdivide the input face into three blocks which include a rectangular block in the middle of the bead, flanked by two curved block caps;

selecting and using a medial axis-based annulus type decomposition algorithm, when the classified type of the input face is the multi-loop annulus type, to subdivide the input face into the plurality of blocks which include a plurality of arched shaped blocks; and selecting and using a combined medial axis based and visibility-based decomposition algorithm, when the classified type of the input face is the multi-loop non-annulus type, to subdivide the input face.

5. The method according to claim 4, wherein when the combined medial axis based and visibility-based decomposition algorithm is selected, further comprising:

carrying out a visibility-based decomposition portion of the algorithm, in which split lines are determined that subdivide the input face into blocks based on orthogonal splitting, symmetry, and shortness of candidate split lines.

6. The method according to claim 2, wherein selecting and using comprises selecting and using an Art Gallery decomposition algorithm, when the classified type of the input face is the single loop non-bead type, to subdivide the input face.

7. The method according to claim 1, wherein the mesh includes interior nodes, wherein the majority of interior nodes have a valency of four, and wherein the majority of quadrilateral elements have four included angles that are between 80-100°.

8. The method according to claim 1, further comprising through operation of the at least one processor:

determining physical effects on the structure based at least in part on the mesh data and data representative of loads applied to the structure provided through operation of at least one input device;

generating at least one graphical user interface (GUI) through a display device, which at least one GUI displays a visual representation of the object model, the mesh for the object model, and the determined physical effects on the structure;

responsive to further inputs through the at least one input device, modifying the object model and storing data representative of the modified object model in at least one data store.

9. A system comprising:

at least one processor configured to:

classify a type of an input face of a three-dimensional (3D) object model of a structure based at least in part on a number of loops included by the input face, including by, for a given input face:

determining whether the input face includes a single loop or multiple loops;

determining whether the input face includes a cylindrical surface;

responsive to a determination that the input face includes a cylindrical surface, classifying the input face as a cylindrical type; and responsive to a determination that the input face does not include a cylindrical surface:

classifying the input face as a multiple-loop annulus type responsive to identification of the input face as an annulus through medial annulus recognition;

classifying the input face as a multiple-loop non-annulus type responsive to identification of the input face as not an annulus through medial annulus recognition;

classifying the input face as a single loop bead type responsive to identification of the input face as a bead through medial bead detection; and classifying the input face as a single loop non-bead type responsive to an identification of the input face as not a bead through medial bead detection; and select, based on the classified type of the input face, a multi-block decomposition algorithm from among a plurality of multi-block decomposition algorithms that the processor is configured to use, wherein the selected multi-block decomposition algorithm differs between each of the cylindrical type, the multiple-loop annulus type, multiple-loop non-annulus type, the single loop bead type, and the single loop non-bead type;

use the selected multi-block decomposition algorithm to determine locations of a plurality of blocks across the input face; and mesh each block to produce mesh data defining a mesh that divides the input face into a plurality of quadrilateral elements.

10. The system of claim 9, wherein the at least one processor is further configured to generate a flattened two-dimensional (2D) representation of the input face, wherein classifying the type of the input face is based on the 2D representation of the input face, wherein using the selected multi-block decomposition algorithm to determine locations of the plurality of blocks across the input face is carried out based on the 2D representation of the input face.

11. The system of claim 9, wherein the at least one processor is further configured to:

determine physical effects on the structure based at least in part on the mesh data and data representative of loads applied to the structure provided through operation of at least one input device;

generate at least one graphical user interface (GUI) through a display device, which at least one GUI displays a visual representation of the object model, the mesh for the object model, and the determined physical effects on the structure; and responsive to further inputs through the at least one input device, modify the object model and storing data representative of the modified object model in at least one data store.

12. A non-transitory computer readable medium comprising executable instructions that, when executed, cause at least one processor to:

classify a type of an input face of a three-dimensional (3D) object model of a structure based at least in part on a number of loops included by the input face, including by, for a given input face:

determining whether the input face includes a single loop or multiple loops;

determining whether the input face includes a cylindrical surface;

responsive to a determination that the input face includes a cylindrical surface, classifying the input face as a cylindrical type; and responsive to a determination that the input face does not include a cylindrical surface:

classifying the input face as a multiple-loop annulus type responsive to identification of the input face as an annulus through medial annulus recognition;

classifying the input face as a multiple-loop non-annulus type responsive to identification of the input face as not an annulus through medial annulus recognition;

classifying the input face as a single loop bead type responsive to identification of the input face as a bead through medial bead detection; and classifying the input face as a single loop non-bead type responsive to an identification of the input face as not a bead through medial bead detection; and select, based on the classified type of the input face, a multi-block decomposition algorithm from among a plurality of multi-block decomposition algorithms that the processor is configured to use, wherein the selected multi-block decomposition algorithm differs between each of the cylindrical type, the multiple-loop annulus type, multiple-loop non-annulus type, the single loop bead type, and the single loop non-bead type;

use the selected multi-block decomposition algorithm to determine locations of a plurality of blocks across the input face; and mesh each block to produce mesh data defining a mesh that divides the input face into a plurality of quadrilateral elements.

13. The non-transitory computer readable medium of claim 12, wherein the executable instructions, when executed, further cause the at least one processor to:

generate a flattened two-dimensional (2D) representation of the input face, wherein classifying the type of the input face is based on the 2D representation of the input face, wherein using the selected multi-block decomposition algorithm to determine locations of the plurality of blocks across the input face is carried out based on the 2D representation of the input face.

14. The non-transitory computer readable medium of claim 12, wherein the executable instructions, when executed, cause the at least one processor to select and use the multi-block decomposition algorithm by selecting and using a Cartesian slab decomposition algorithm, when the classified type of the input face is the cylindrical type, to subdivide into a several parallel slab shaped blocks that are parallel to the axis of a cylindrical surface of the input face.

15. The non-transitory computer readable medium of claim 12, wherein the executable instructions, when executed, cause the at least one processor to select and use the multi-block decomposition algorithm by:

selecting and using a medial axis-based bead decomposition algorithm, when the classified type of the input face is the single loop bead type, to subdivide the input face into three blocks which include a rectangular block in the middle of the bead, flanked by two curved block caps;

selecting and using a medial axis-based annulus type decomposition algorithm, when the classified type of the input face is the multi-loop annulus type, to subdivide the input face into the plurality of blocks which include a plurality of arched shaped blocks; and selecting and using a combined medial axis based and visibility-based decomposition algorithm, when the classified type of the input face is the multi-loop non-annulus type, to subdivide the input face.

16. The non-transitory computer readable medium of claim 15, wherein, when the combined medial axis based and visibility-based decomposition algorithm is selected, the executable instructions, when executed, further cause the at least one processor to:

carry out a visibility-based decomposition portion of the algorithm, in which split lines are determined that subdivide the input face into blocks based on orthogonal splitting, symmetry, and shortness of candidate split lines.

17. The non-transitory computer readable medium of claim 12, wherein the executable instructions, when executed, cause the at least one processor to select and use the multi-block decomposition algorithm by selecting and using an Art Gallery decomposition algorithm, when the classified type of the input face is the single loop non-bead type, to subdivide the input face.

18. The non-transitory computer readable medium of claim 12, wherein the mesh includes interior nodes, wherein the majority of interior nodes have a valency of four, and wherein the majority of quadrilateral elements have four included angles that are between 80-100°.

19. The non-transitory computer readable medium of claim 12, wherein the executable instructions, when executed, further cause the at least one processor to:
- determine physical effects on the structure based at least in part on the mesh data and data representative of loads applied to the structure provided through operation of at least one input device;
- generate at least one graphical user interface (GUI) through a display device, which at least one GUI displays a visual representation of the object model, the mesh for the object model, and the determined physical effects on the structure;
- responsive to further inputs through the at least one input device, modify the object model and storing data representative of the modified object model in at least one data store.

* * * * *